(12) United States Patent
Tsai et al.

(10) Patent No.: US 12,027,494 B2
(45) Date of Patent: Jul. 2, 2024

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Hao-Yi Tsai, Hsinchu (TW); Tzuan-Horng Liu, Taoyuan (TW); Chien-Ling Hwang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 81 days.

(21) Appl. No.: 17/314,017

(22) Filed: May 6, 2021

(65) Prior Publication Data

US 2022/0359468 A1   Nov. 10, 2022

(51) Int. Cl.
| | |
|---|---|
| H01L 21/768 | (2006.01) |
| H01L 21/48 | (2006.01) |
| H01L 21/56 | (2006.01) |
| H01L 21/66 | (2006.01) |
| H01L 21/68 | (2006.01) |
| H01L 23/00 | (2006.01) |
| H01L 23/31 | (2006.01) |
| H01L 23/495 | (2006.01) |
| H01L 23/498 | (2006.01) |
| H01L 23/522 | (2006.01) |
| H01L 23/528 | (2006.01) |

(Continued)

(52) U.S. Cl.
CPC .......... *H01L 25/0657* (2013.01); *H01L 21/56* (2013.01); *H01L 23/31* (2013.01); *H01L 23/49816* (2013.01); *H01L 23/5384* (2013.01); *H01L 23/5385* (2013.01); *H01L 24/14* (2013.01)

(58) Field of Classification Search
CPC ................. H01L 23/5384; H01L 24/14; H01L 2924/00014; H01L 2224/13164; H01L 2224/1147; H01L 2224/11462; H01L 2224/73204; H01L 2224/16225; H01L 2224/32225; H01L 2924/00; H01L 2224/16145; H01L 2224/32145; H01L 25/0657; H01L 21/56; H01L 23/31; H01L 23/49816; H01L 23/5385

See application file for complete search history.

(56) References Cited

U.S. PATENT DOCUMENTS

| | | | |
|---|---|---|---|
| 8,883,563 B1 * | 11/2014 | Haba .................... | H01L 21/563 438/117 |
| 9,000,584 B2 | 4/2015 | Lin et al. | |

(Continued)

*Primary Examiner* — Antonio B Crite
*Assistant Examiner* — Tenley H Schofield
(74) *Attorney, Agent, or Firm* — JCIPRNET

(57) ABSTRACT

A semiconductor device includes an integrated circuit, first conductive features, second conductive features, a package structure, and an encapsulant. The integrated circuit has an active surface and a rear surface opposite to the active surface. The first conductive features surround the integrated circuit. The second conductive features are stacked on the first conductive features. The package structure is disposed on the second conductive features and the rear surface of the integrated circuit. The encapsulant laterally encapsulates the integrated circuit, the first conductive features, the second conductive features, and the package structure.

20 Claims, 27 Drawing Sheets

(51) Int. Cl.
*H01L 23/532* (2006.01)
*H01L 23/538* (2006.01)
*H01L 25/065* (2023.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,483,211 B2 * | 11/2019 | Lin | H01L 28/20 |
| 2011/0117700 A1 * | 5/2011 | Weng | H01L 21/56 |
| | | | 438/109 |
| 2011/0140258 A1 * | 6/2011 | Do | H01L 25/105 |
| | | | 257/E21.511 |
| 2014/0167269 A1 * | 6/2014 | Lu | H01L 25/04 |
| | | | 257/773 |
| 2015/0123268 A1 * | 5/2015 | Yu | H01L 24/13 |
| | | | 257/737 |
| 2016/0148904 A1 * | 5/2016 | Zhai | H01L 24/96 |
| | | | 438/109 |
| 2016/0225692 A1 * | 8/2016 | Kim | H01L 23/49827 |
| 2017/0323868 A1 * | 11/2017 | Park | H01L 25/0657 |
| 2018/0294241 A1 * | 10/2018 | Chen | H01L 21/6835 |
| 2019/0333871 A1 * | 10/2019 | Chen | H01L 23/5384 |
| 2022/0165680 A1 * | 5/2022 | Kim | H01L 23/49822 |

\* cited by examiner

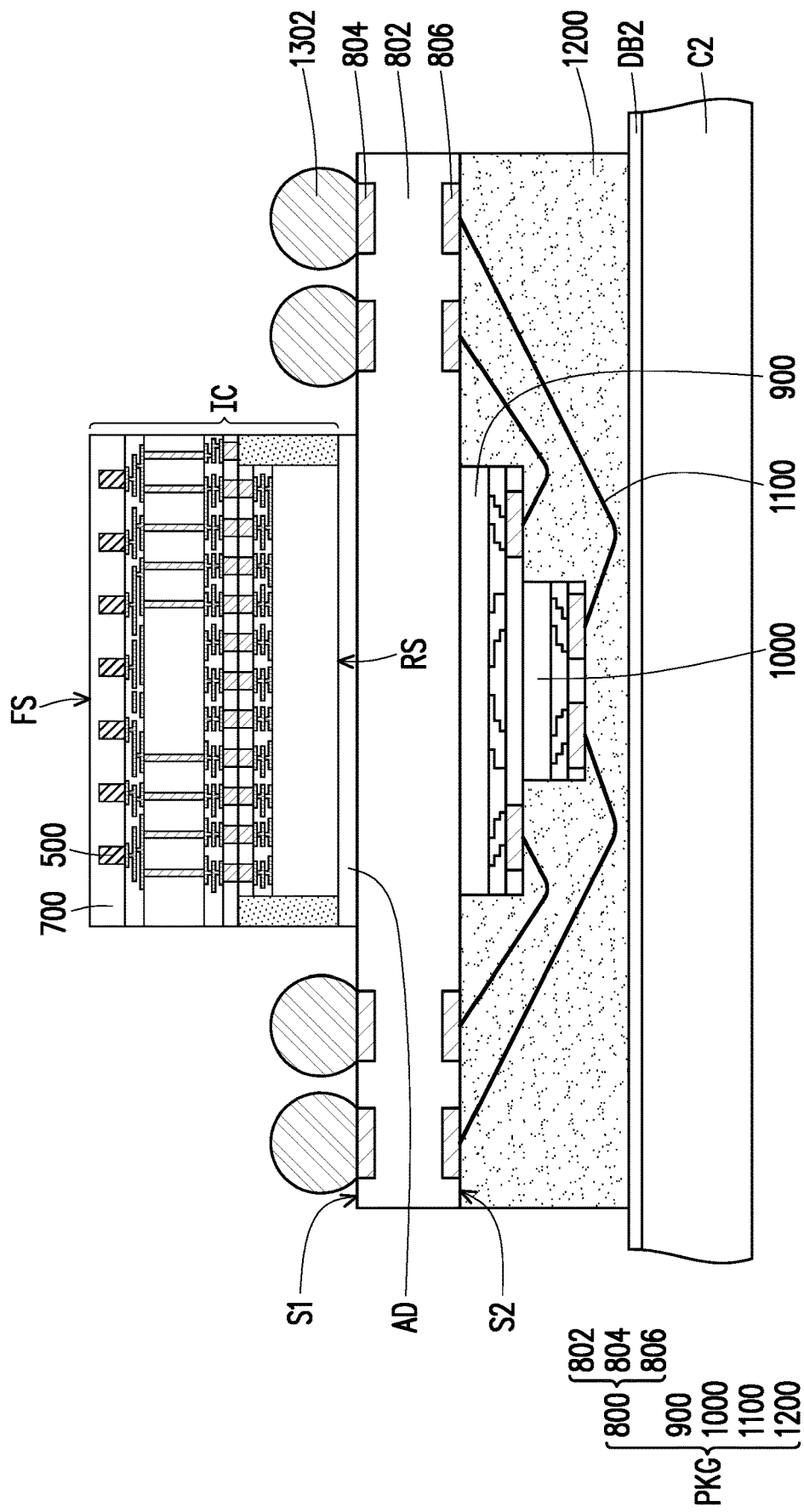

SEMICONDUCTOR DEVICE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A to FIG. 4G are schematic cross-sectional views illustrating a manufacturing process of a semiconductor device in accordance with some alternative embodiments of the disclosure.

DETAILED DESCRIPTION

Figure 1A:
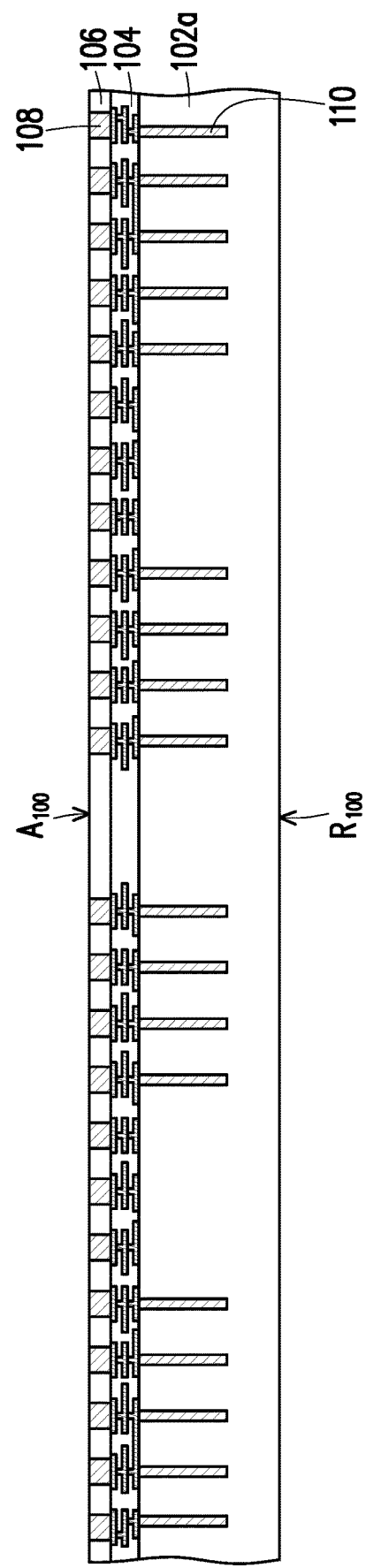
FIG. 1A to FIG. 1H are schematic cross-sectional views illustrating a manufacturing process of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a manufacturing process of an integrated circuit IC in accordance with some embodiments of the disclosure. Referring to FIG. 1A, a semiconductor wafer WS is provided. The semiconductor wafer WS includes a semiconductor substrate 102a, an interconnection structure 104, a dielectric layer 106, a plurality of conductors 108, and a plurality of through semiconductor vias (TSV) 110. In some embodiments, the semiconductor substrate 102a is a silicon substrate. In some embodiments, the semiconductor substrate 102a includes active components (e.g., transistors or the like) and/or passive components (e.g., resistors, capacitors, inductors, or the like) formed therein.

As illustrated in FIG. 1A, the interconnection structure 104 is disposed on the semiconductor substrate 102a and the dielectric layer 106 covers the interconnection structure 104. In some embodiments, the interconnection structure 104 includes a plurality of conductive patterns embedded in a dielectric material. In some embodiments, the conductors 108 are embedded in the dielectric layer 106. For example, the conductors 108 are laterally encapsulated by the dielectric layer 106. The conductors 108 are electrically connected to the semiconductor substrate 102a through the interconnection structure 104. For example, the conductors 108 may be electrically connected to the active components and/or the passive components in the semiconductor substrate 102a through the interconnection structure 104. In some embodiments, the material of the conductors 108 includes copper or other suitable metallic material while the material of the dielectric layer 106 includes silicon oxide, silicon nitride, silicon oxynitride, or other suitable dielectric materials.

In some embodiments, the dielectric layer 106 may be formed by depositing a dielectric material layer on the interconnection structure 104 and patterning the dielectric material layer to form a plurality of openings in the dielectric material layer. The openings formed in the dielectric layer 106 expose portions of the conductive patterns of the interconnection structure 104. After the dielectric layer 106 is patterned, a conductive material layer may be deposited on the dielectric layer 106 and the portions of the conductive patterns of the interconnection structure 104 exposed by the openings of the dielectric layer 106. Then, a polishing process (e.g., a chemical mechanical polishing (CMP) process) is performed to partially remove the conductive material layer until a top surface of the dielectric layer 106 is exposed. After performing the polishing process, the conductors 108 are formed in the openings of the dielectric layer 106.

In some embodiments, the TSVs 110 are embedded in the semiconductor substrate 102a and are not revealed. The TSVs 110 are electrically connected to the interconnection structure 104. In some embodiments, top surfaces of the conductors 108 and the top surface of the dielectric layer 106 are collectively referred to as an active surface $A_{100}$ of the semiconductor wafer WS. On the other hand, the surface of the semiconductor wafer WS opposite to the active surface $A_{100}$ may be referred to as a rear surface $R_{100}$ of the semiconductor wafer WS. As illustrated in FIG. 1A, the top surfaces of the conductors 108 and the top surface of the dielectric layer 106 are substantially located at the same level height to provide an appropriate active surface $A_{100}$ for hybrid bonding.

Figure 1B:
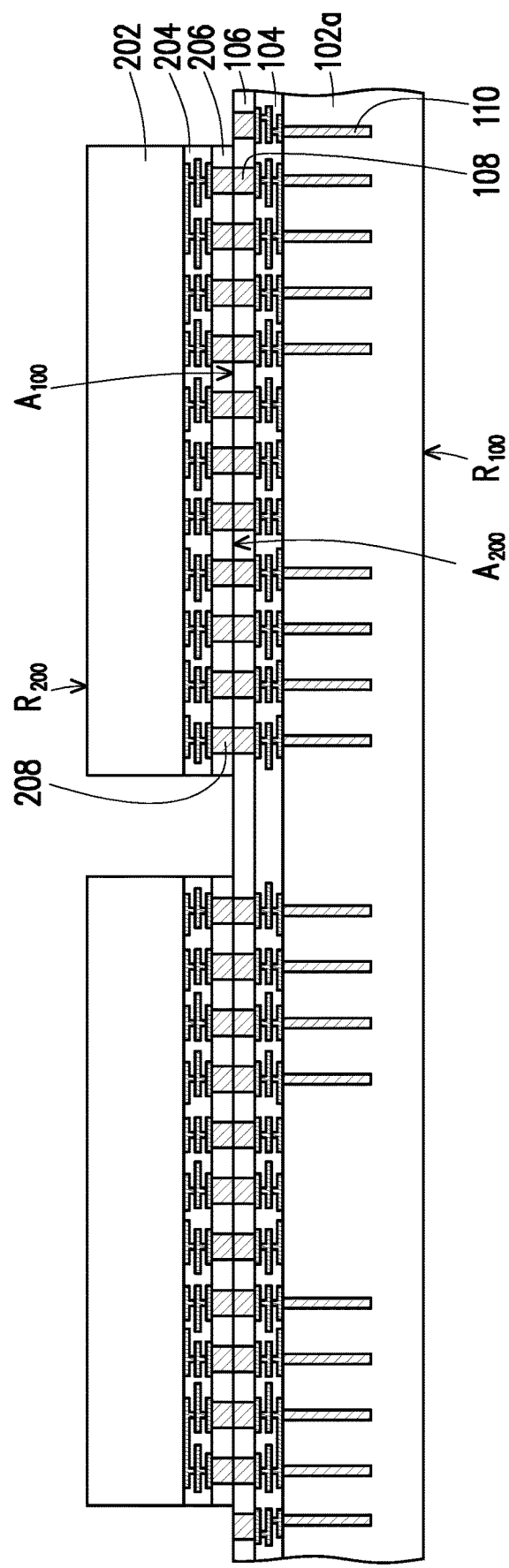

Referring to FIG. 1B, a plurality of dies 200 is picked-and-placed onto the active surface $A_{100}$ of the semiconductor wafer WS. In some embodiments, the dies 200 are arranged on the semiconductor wafer WS in an array. In some embodiments, a thickness of each die 200 ranges from about 50 μm to about 250 μm. In some embodiments, each die 200 includes a semiconductor substrate 202, an interconnection structure 204, a dielectric layer 206, and a plurality of conductors 208. The semiconductor substrate 202, the interconnection structure 204, the dielectric layer 206, and the conductors 208 are respectively similar to the semiconductor substrate 102a, the interconnection structure 104, the dielectric layer 106, and the conductors 108 of the semiconductor wafer WS, so the detailed descriptions thereof are omitted herein. In some embodiments, the dies 200 are capable of performing logic functions. For example, the dies 200 may be Central Process Unit (CPU) dies, Graphic Process Unit (GPU) dies, Field-Programmable Gate Array (FPGA), or the like. In some embodiments, bottom surfaces of the conductors 208 and a bottom surface of the dielectric layer 206 shown in FIG. 1B are collectively referred to as an active surface $A_{200}$ of the die 200. On the other hand, the surface of the die 200 opposite to the active surface $A_{200}$ may be referred to as a rear surface 8200 of the die 200. That is, the dies 200 are being placed such that the active surfaces $A_{200}$ face the semiconductor wafer WS while the rear surfaces $R_{200}$ face upward. As illustrated in FIG. 1B, the bottom surfaces of the conductors 208 and the bottom surface of the dielectric layer 206 are substantially located at the same level height to provide an appropriate active surface $A_{200}$ for hybrid bonding.

In some embodiments, the dies 200 are hybrid bonded to the semiconductor wafer WS. For example, the dies 200 are placed such that the active surface $A_{200}$ of each die 200 is in physical contact with the active surfaces $A_{100}$ of the semiconductor wafer WS, and the conductors 208 of the dies 200 are substantially aligned and in direct contact with some of the conductors 108 of the semiconductor wafer WS.

In some embodiments, to facilitate the hybrid bonding between the semiconductor wafer WS and the dies 200, surface preparation for bonding surfaces (i.e. the active surface $A_{100}$ and the active surface $A_{200}$) of the semiconductor wafer WS and the dies 200 is performed. The surface preparation may include surface cleaning and activation, for example. Surface cleaning may be performed on the active surfaces $A_{100}$, $A_{200}$ to remove particles on the top surfaces of the conductors 108, 208 and the dielectric layers 106, 206. In some embodiments, the active surfaces $A_{100}$, $A_{200}$ may be cleaned by wet cleaning, for example. Not only particles are removed, but also native oxide formed on the top surfaces of the conductors 108, 208 may be removed. The native oxide formed on the top surfaces of the conductors 108, 208 may be removed by chemicals used in wet cleaning processes, for example.

After cleaning the active surface $A_{100}$ of the semiconductor wafer WS and the active surface $A_{200}$ of the dies 200, activation of the top surfaces of the dielectric layers 106, 206 may be performed for development of high bonding strength. In some embodiments, plasma activation may be performed to treat the top surfaces of the dielectric layers 106, 206. When the activated top surface of the dielectric layer 106 is in physical contact with the activated top surface of the dielectric layer 206, the dielectric layer 106 of the semiconductor wafer WS and the dielectric layer 206 of the dies 200 are pre-bonded.

After pre-bonding the dies 200 onto the semiconductor wafer WS, hybrid bonding of the semiconductor wafer WS and the dies 200 is performed. The hybrid bonding of the semiconductor wafer WS and the dies 200 may include a thermal treatment for dielectric bonding and a thermal annealing for conductor bonding. In some embodiments, the thermal treatment for dielectric bonding is performed to strengthen the bonding between the dielectric layers 106, 206. For example, the thermal treatment for dielectric bonding may be performed at temperature ranging from about 100 Celsius degree to about 150 Celsius degree. After performing the thermal treatment for dielectric bonding, the thermal annealing for conductor bonding is performed to facilitate the bonding between the conductors 108, 208. For example, the thermal annealing for conductor bonding may be performed at temperature ranging from about 300 Celsius degree to about 400 Celsius degree. The process temperature of the thermal annealing for conductor bonding is higher than that of the thermal treatment for dielectric bonding. After performing the thermal annealing for conductor bonding, the dielectric layer 106 is bonded to the dielectric layer 206 and the conductors 108 are bonded to the conductors 208. In some embodiments, the conductors 108 of the semiconductor wafer WS and the conductors 208 of the dies 200 may respectively be conductive vias (e.g., copper vias), conductive pads (e.g., copper pads), or combinations thereof. For example, the conductor bonding between the conductors 108, 208 may be via-to-via bonding, pad-to-pad bonding, or via-to-pad bonding. In some embodiments, sidewalls of the conductors 108 are aligned with sidewalls of the conductors 208.

In some embodiments, not all of the conductors 108 are being bonded to the corresponding conductor 208. For example, as shown in FIG. 1B, some conductors 108 are not bonded to the dies 200 and are being exposed by the dies 200. These conductors 108 may serve as dummy conductors 108 and do not contribute to electrical conduction or signal transmission in the subsequently formed semiconductor device. In other words, these conductors 108 are electrically floating.

Figure 1C:
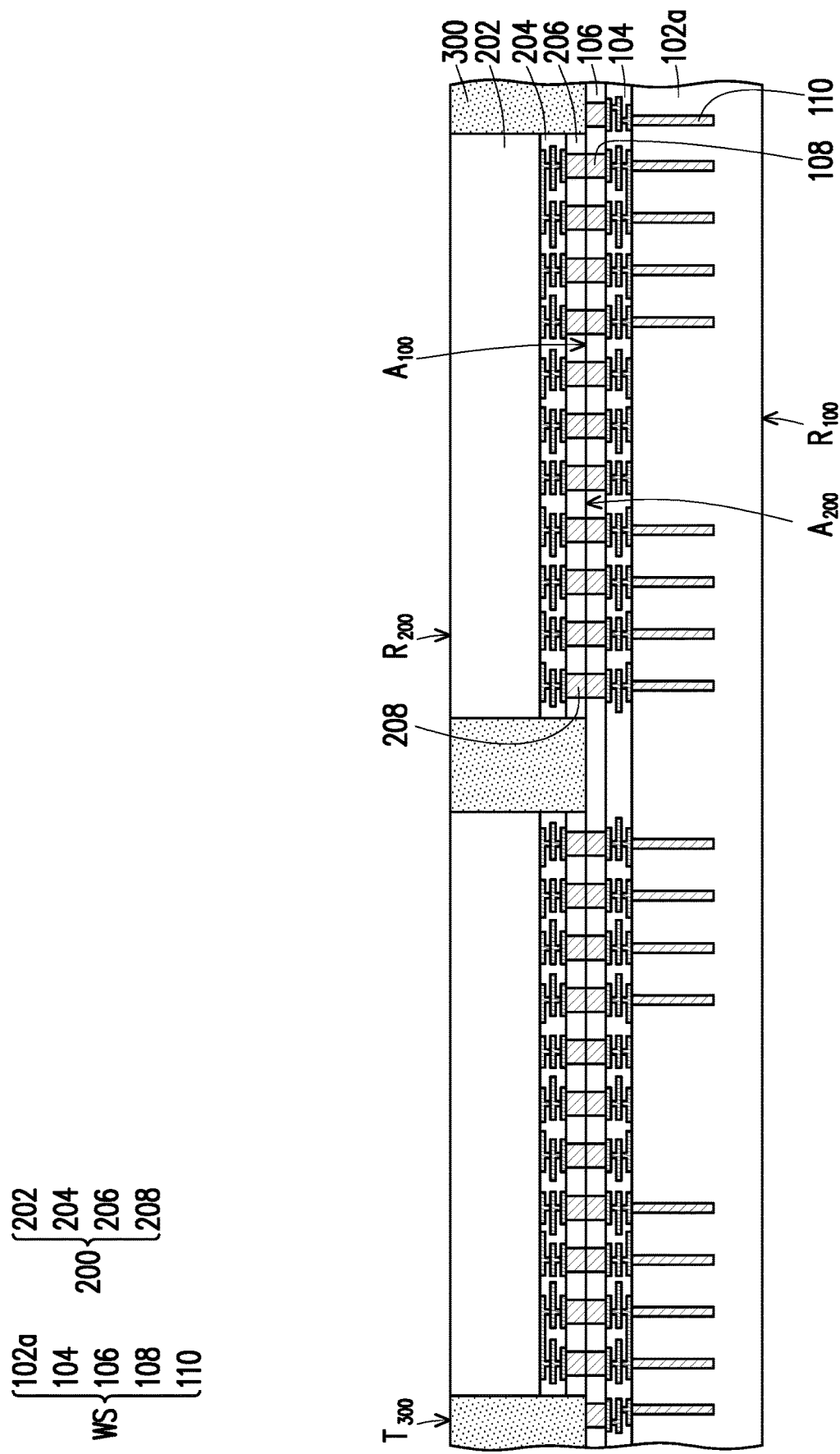

Referring to FIG. 1C, an encapsulant 300 is formed on the semiconductor wafer WS to laterally encapsulate the dies 200. For example, the encapsulant 300 is formed to fill in the gaps between adjacent dies 200. In some embodiments, the encapsulant 300 includes a molding compound, a molding underfill, a resin (such as epoxy), or the like. In some alternative embodiments, the encapsulant 300 may include silicon oxide and/or silicon nitride. In some embodiments, the encapsulant 300 is formed through chemical vapor deposition (CVD), plasma-enhanced chemical vapor deposition (PECVD), atomic layer deposition (ALD), or the like. In some embodiments, the encapsulant 300 is free of filler. In some embodiments, the encapsulant 300 is referred to as "gap fill oxide." In some embodiments, a planarization process is performed on the rear surfaces 8200 of the dies 200 and a top surface $T_{300}$ of the encapsulant 300 to further reduce the overall thickness of the subsequently formed integrated circuit. For example, a thickness of the encapsulant 300 is substantially equal to the thickness of the dies 200. Meanwhile, the top surface $T_{300}$ of the encapsulant 300 is substantially coplanar with the rear surfaces $R_{200}$ of the dies 200. That is, the thickness of the encapsulant 300 ranges from about 50 μm to about 250 μm. In some embodiments, the planarization process includes a mechanical grinding process and/or a CMP process.

Figure 1D:
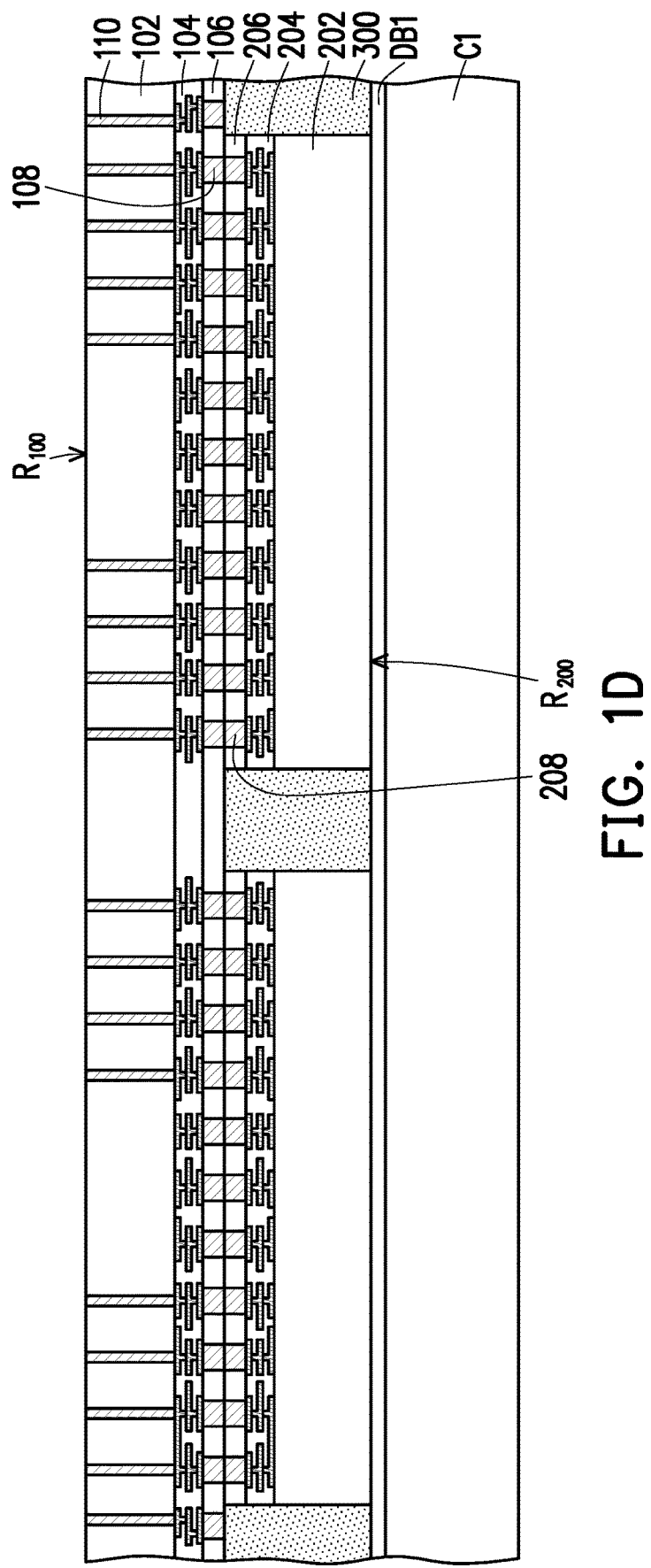

Referring to FIG. 1C and FIG. 1D, the structure illustrated in FIG. 1C is flipped upside down and is attached to a carrier C1 through a de-bonding layer DB1. For example, the rear surfaces $R_{200}$ of the dies 200 are attached to the de-bonding layer DB1. In some embodiments, the carrier C1 is a semiconductor carrier, such as a silicon carrier. However, the disclosure is not limited thereto. In some alternative embodiments, the carrier C1 may be a glass carrier. In some embodiments, the de-bonding layer DB1 is a light-to-heat conversion (LTHC) release layer. Thereafter, a planarization process is performed on the rear surface $R_{100}$ of the semiconductor wafer WS. In some embodiments, the planarization process includes a mechanical grinding process and/or a CMP process. In some embodiments, the semiconductor substrate 102a of the semiconductor wafer WS is grinded until the TSVs 110 are revealed, so as to form a semiconductor substrate 102. For example, after the planarization process, the TSVs 110 penetrate through the semiconductor substrate 102. The TSVs 110 allow electrical communication between the front side and the back side of the semiconductor wafer WS. In some embodiments, after the TSVs 110 are revealed, the semiconductor wafer WS is further grinded to reduce the overall thickness of the semiconductor wafer WS. For example, after the grinding process, a thickness of the semiconductor wafer WS may range between about 10 μm and about 20 μm. In some embodiments, after the TSVs 110 are revealed, the semiconductor substrate 102 is recessed such that each TSV 110 protrudes from the semiconductor substrate 102. Thereafter, a dielectric layer (not shown) may fill into the recess to laterally wrap around the protruded portion of each TSV 110. In some embodiments, the dielectric layer that fills into the recess includes low temperature silicon nitride or the like.

Figure 1E:
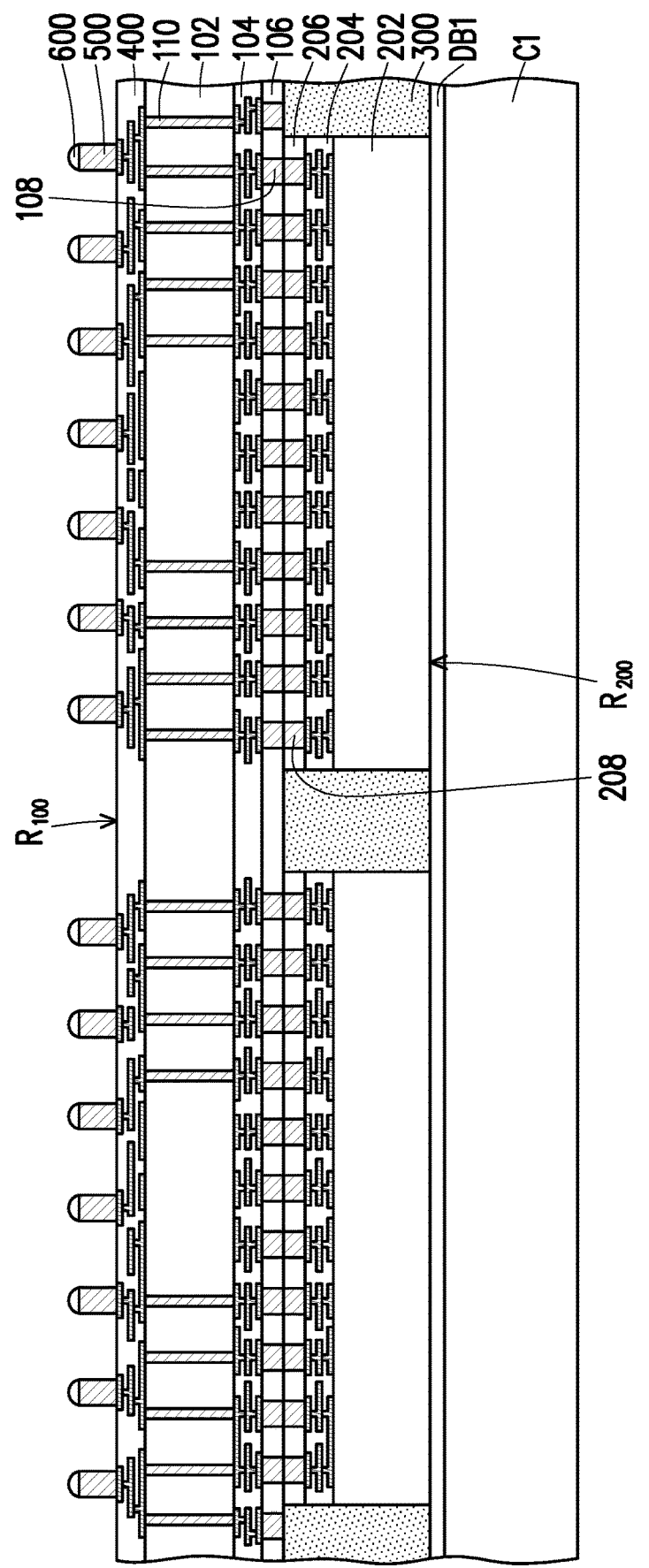

Referring to FIG. 1E, an interconnection structure 400, a plurality of conductive vias 500, and a plurality of conductive caps 600 are formed on the rear surface $R_{100}$ of the semiconductor wafer WS. The interconnection structure 400 includes a plurality of conductive patterns embedded in a dielectric material. In some embodiments, the interconnection structure 400 is electrically connected to the TSVs 110 of the semiconductor wafer WS. For example, the conductive patterns of the interconnection structure 400 may be in direct contact with the TSVs 110 of the semiconductor wafer WS to render electrical connection with the TSVs 110.

In some embodiments, the conductive vias 500 are formed on the interconnection structure 400. In some embodiments, the conductive vias 500 are formed on and directly in contact with the conductive patterns of the interconnection structure 400. That is, the conductive vias 500 are electrically connected to the dies 200 sequentially through the interconnection structure 400, the TSVs 110, the interconnection structure 104, and the conductors 108. In some embodiments, the conductive vias 500 are made of conductive materials and are plated on the conductive patterns of the interconnection structure 400. For example, a material of the conductive vias 500 may include copper, copper alloy, or the like.

In some embodiments, the conductive caps 600 are formed on the conductive vias 500. In some embodiments, the conductive caps 600 are made of a conductive material with low resistivity, such as Sn, Pb, Ag, Cu, Ni, Bi, or an alloy thereof. In some embodiments, the conductive caps 600 are temporary formed on the conductive vias 500 for electrical testing purposes. For example, testing probes (not shown) may be placed to be in physical contact with the conductive caps 600 to verify the electrical conduction and the signal transmission of the structure shown in FIG. 1E.

Figure 1F:
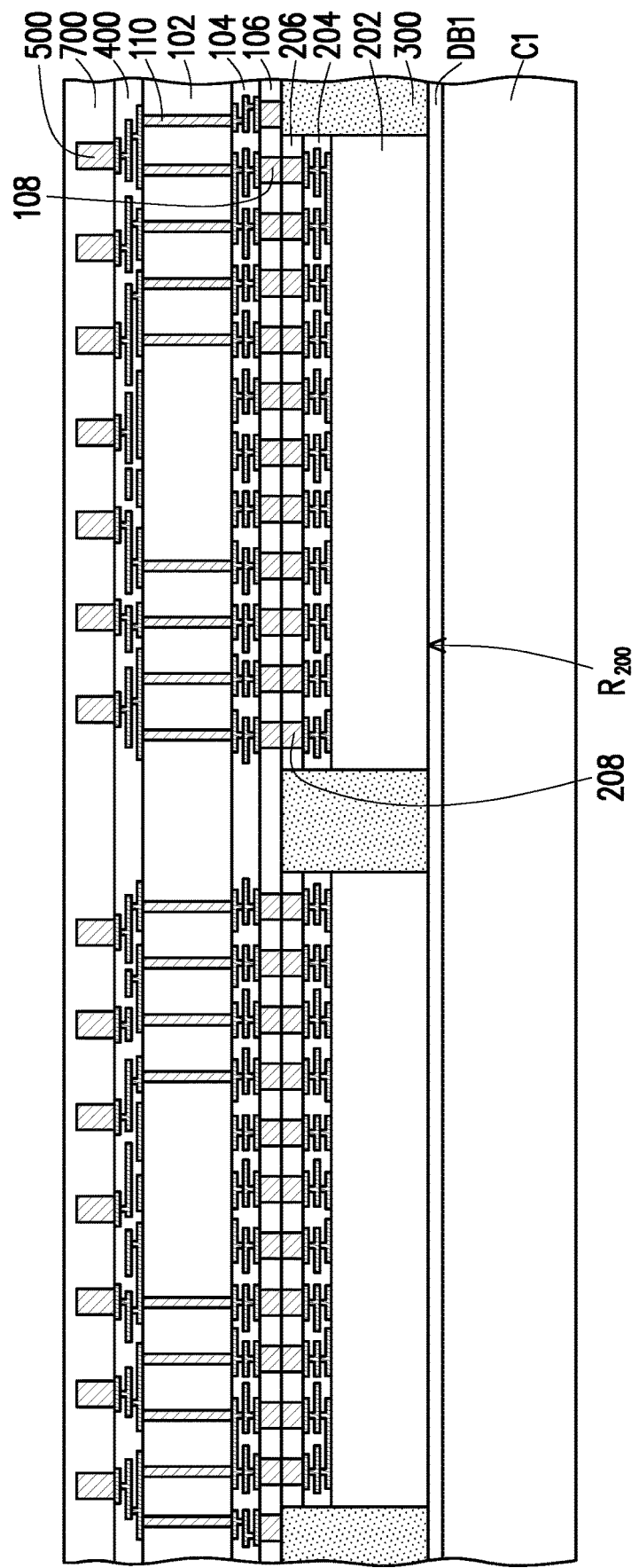

Referring to FIG. 1E and FIG. 1F, after the testing process is completed, the conductive caps 600 are removed. The conductive caps 600 may be removed by, for example, an etching process, or the like. Thereafter, a protection layer 700 is formed on the interconnection structure 400 to cover the conductive vias 500. In some embodiments, a material of the protection layer 700 includes polyimide, epoxy resin, acrylic resin, phenol resin, benzocyclobutene (BCB), polybenzoxazole (PBO), or any other suitable polymer-based dielectric material. The protection layer 700, for example, may be formed by suitable fabrication techniques such as spin-on coating, CVD, PECVD, or the like. As illustrated in FIG. 1F, the conductive vias 500 are buried within and are well-protected by the protection layer 700. However, the disclosure is not limited thereto. In some alternative embodiments, the protection layer 700 may expose top surfaces of the conductive vias 500. In some embodiments, a thickness of the protection layer 700 ranges from about 15 μm to about 25 μm.

Figure 1G:
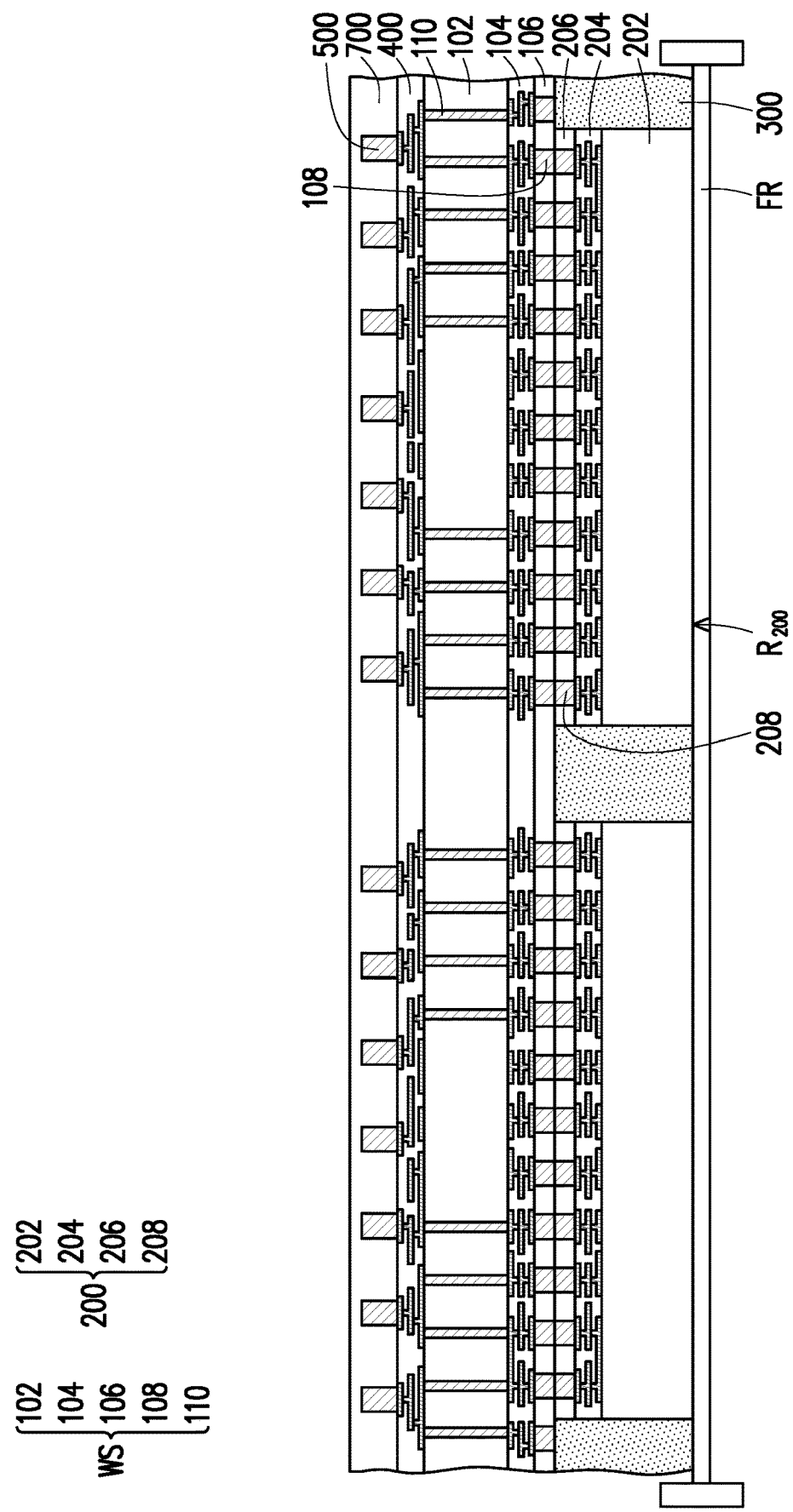

Referring to FIG. 1F and FIG. 1G, the dies 200 and the encapsulant 300 are de-bonded form the de-bonding layer DB1 such that the dies 200 and the encapsulant 300 are separated from the carrier C1. In some embodiments, the de-bonding layer DB1 (e.g., the LTHC release layer) is irradiated by an UV laser such that the de-bonding layer DB1 and the carrier C1 may be peeled off from the dies 200 and the encapsulant 300. After the de-bonding process, the de-bonded structure is placed on a frame structure FR for further processing. In some embodiments, the frame structure FR includes a dicing tape, and the de-bonded structure is placed on the dicing tape.

Figure 1H:
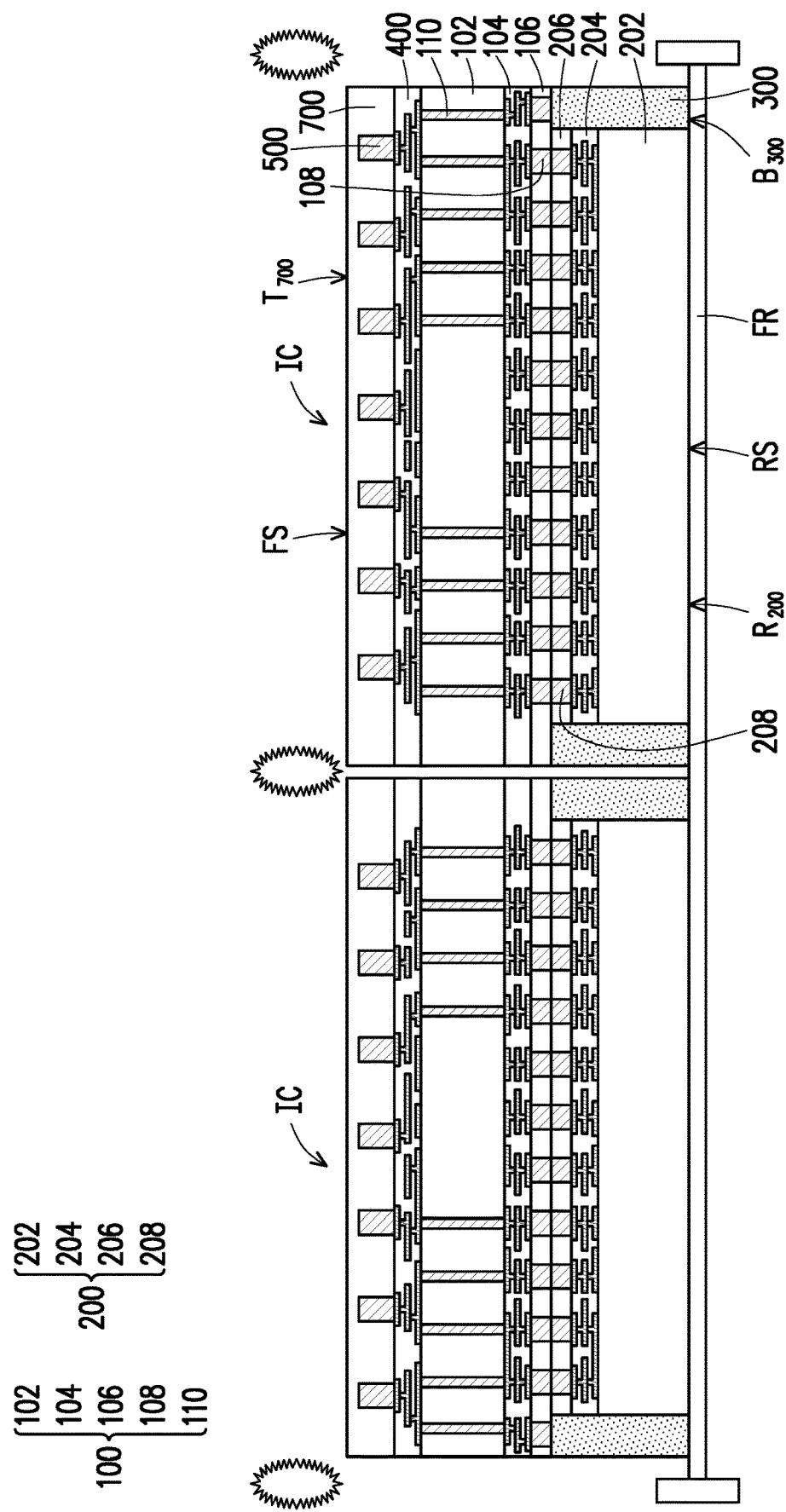

Referring to FIG. 1G and FIG. 1H, a singulation process is performed on the de-bonded structure to obtain a plurality of integrated circuits IC. In some embodiments, the singulation process typically involves dicing with a rotating blade or a laser beam. In other words, the singulation process is, for example, a laser cutting process, a mechanical cutting process, or other suitable processes. In some embodiments, the singulation process divides the semiconductor wafer WS into a plurality of dies 100. That is, each die 100 includes the semiconductor substrate 102, the interconnection structure 104, the dielectric layer 106, the conductors 108, and the TSVs 110. In some embodiments, the dies 100 are capable of performing logic functions. For example, the dies 100 may be CPU dies, GPU dies, FPGA, or the like. In some embodiments, each integrated circuit IC includes the die 100, the die 200, the encapsulant 300, the interconnection structure 400, the conductive vias 500, and the protection layer 700. The die 200 is stacked on and hybrid bonded to the die 100. Meanwhile, the encapsulant 300 laterally encapsulates the die 200. In some embodiments, the interconnection structure 400 is disposed on the die 100 opposite to the die 200. The conductive vias 500 and the protection layer 700 are disposed on the interconnection structure 400. As illustrated in FIG. 1H, each integrated circuit IC has a front surface FS and a rear surface RS opposite to the front surface FS. For example, the rear surface $R_{200}$ of the die 200 and a bottom surface $B_{300}$ of the encapsulant 300 constitute the rear surface RS of the integrated circuit IC. Meanwhile, a top surface $T_{700}$ of the protection layer 700 constitutes the front surface FS of the integrated circuit IC.

In some embodiments, the integrated circuit IC is utilized in various applications. For example, the integrated circuit IC may be packaged with other package structures to form a semiconductor device. The manufacturing process of the semiconductor device will be described below.

Figure 2A:
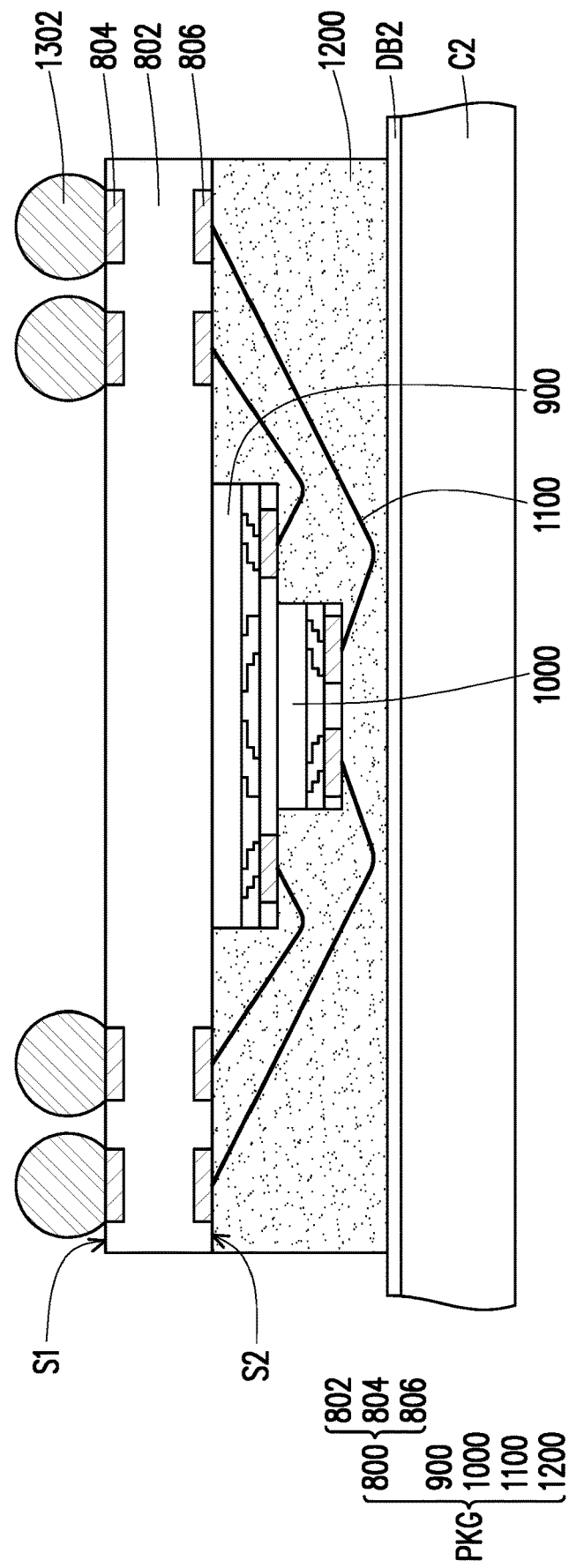
FIG. 2A to FIG. 2F are schematic cross-sectional views illustrating a manufacturing process of a semiconductor device in accordance with some embodiments of the disclosure.

FIG. 2A to FIG. 2F are schematic cross-sectional views illustrating a manufacturing process of a semiconductor device 10 in accordance with some embodiments of the disclosure. Referring to FIG. 2A, a carrier C2 having a de-bonding layer DB2 formed thereon is provided. The carrier C2 and the de-bonding layer DB2 in FIG. 2A are respectively similar to the carrier C1 and the de-bonding layer DB1 in FIG. 1D, so the detailed descriptions thereof are omitted herein. Thereafter, a plurality of package structures PKG is disposed on the carrier C2. For simplicity, one package structure PKG is shown in FIG. 2A. In some embodiments, the package structures PKG are picked-and-placed on the de-bonding layer DB2 such that the package structures PKG are attached to the carrier C2 through the de-bonding layer DB2. In some embodiments, the package structures PKG are arranged in an array over the carrier C2. In some embodiments, each package structure PKG includes die 800, die 900, die 1000, a plurality of conductive wires 1100, and an encapsulant 1200.

In some embodiments, the die 800 includes a semiconductor substrate 802, conductive pads 804, and conductive pads 806. The semiconductor substrate 802 may include active components (e.g., transistors or the like) and/or passive components (e.g., resistors, capacitors, inductors, or the like) formed therein. The conductive pads 804 and the conductive pads 806 are formed on two opposite surfaces of the semiconductor substrate 802 for external connection. For example, the conductive pads 804 are located at a first surface S1 of the die 800 while the conductive pads 806 are located at a second surface S2 opposite to the first surface S1. In some embodiments, the conductive pads 804 and the conductive pads 806 are aluminum pads, copper pads, or other suitable metal pads. In some embodiments, the die 800 are capable of performing storage functions. For example, the die 800 may be Dynamic Random Access Memory (DRAM), Resistive Random Access Memory (RRAM), Static Random Access Memory (SRAM), or the like. However, the disclosure is not limited thereto. In some alternative embodiments, the die 800 may be CPU dies, GPU dies, FPGA, or the like.

As illustrated in FIG. 2A, the die 900 and the die 1000 are sequentially stacked on the second surface S2 of the die 800. In some embodiments, the dies 900 and 1000 respectively includes transistors, capacitors, inductors, resistors, and/or metallization layers formed therein, as desired for a particular functionality. In some embodiments, the dies 900 and 1000 are respectively CPU dies, GPU dies, FPGA, or the like. In some embodiments, the dies 900 and 1000 are electrically connected to the die 800 through wire bonding. For example, conductive wires 1100 extend between the conductive features of the die 900 and the conductive pads 806 of the die 800 to establish electrical connection between the dies 800 and 900. Similarly, conductive wires 1100 extend between the conductive features of the die 1000 and the conductive pads 806 of the die 800 to establish electrical connection between the dies 800 and 1000. In some embodiments, a material of the conductive wire 1100 includes gold, aluminum, or other suitable conductive materials.

In some embodiments, the encapsulant 1200 is formed on the second surface S2 of the die 800 to encapsulate the die 900, the die 1000, and the conductive wires 1100. In some embodiments, the encapsulant 1200 is a molding compound, a molding underfill, a resin (such as epoxy), or the like. In some alternative embodiments, the encapsulant 1200 includes a photosensitive material such as PBO, polyimide, BCB, a combination thereof, or the like. In some embodiments, the encapsulant 1200 is formed by a molding process, such as a compression molding process. In some embodiments, the encapsulant 1200 further includes fillers embedded therein to enhance the mechanical strength thereof. The fillers include, for example, particles of $Al_2O_3$, $SiO_2$, $TiO_2$, and/or the like. However, the disclosure is not limited thereto. In some alternative embodiments, the encapsulant 1200 is free of filler.

As illustrated in FIG. 2A, the package structure PKG is placed over the carrier C2 such that the first surface S1 of the die 800 faces upward. Meanwhile, the encapsulant 1200 is in physical contact with the de-bonding layer DB2. After the package structure PKG is placed over the carrier C2, a plurality of conductive features 1302 is formed on the package structure PKG. For example, the conductive features 1302 are formed on the first surface S1 of the die 800. In some embodiments, the conductive features 1302 are formed on the conductive pads 804 to render electrical connection with the package structure PKG. In some embodiments, the conductive features 1302 include conductive balls, conductive bumps, or the like. In some embodiments, the conductive features 1302 are spherical. However, the disclosure is not limited thereto. In some alternative embodiments, the conductive features 1302 may be elliptical. In some embodiments, a material of the conductive features 1302 includes solder or the like. In some embodiments, the conductive features 1302 are formed on the package structure PKG through a ball placement process followed by a reflow process. In some embodiments, a height of each conductive feature 1302 ranges from about 80 μm to about 180 μm.

Figure 2B:
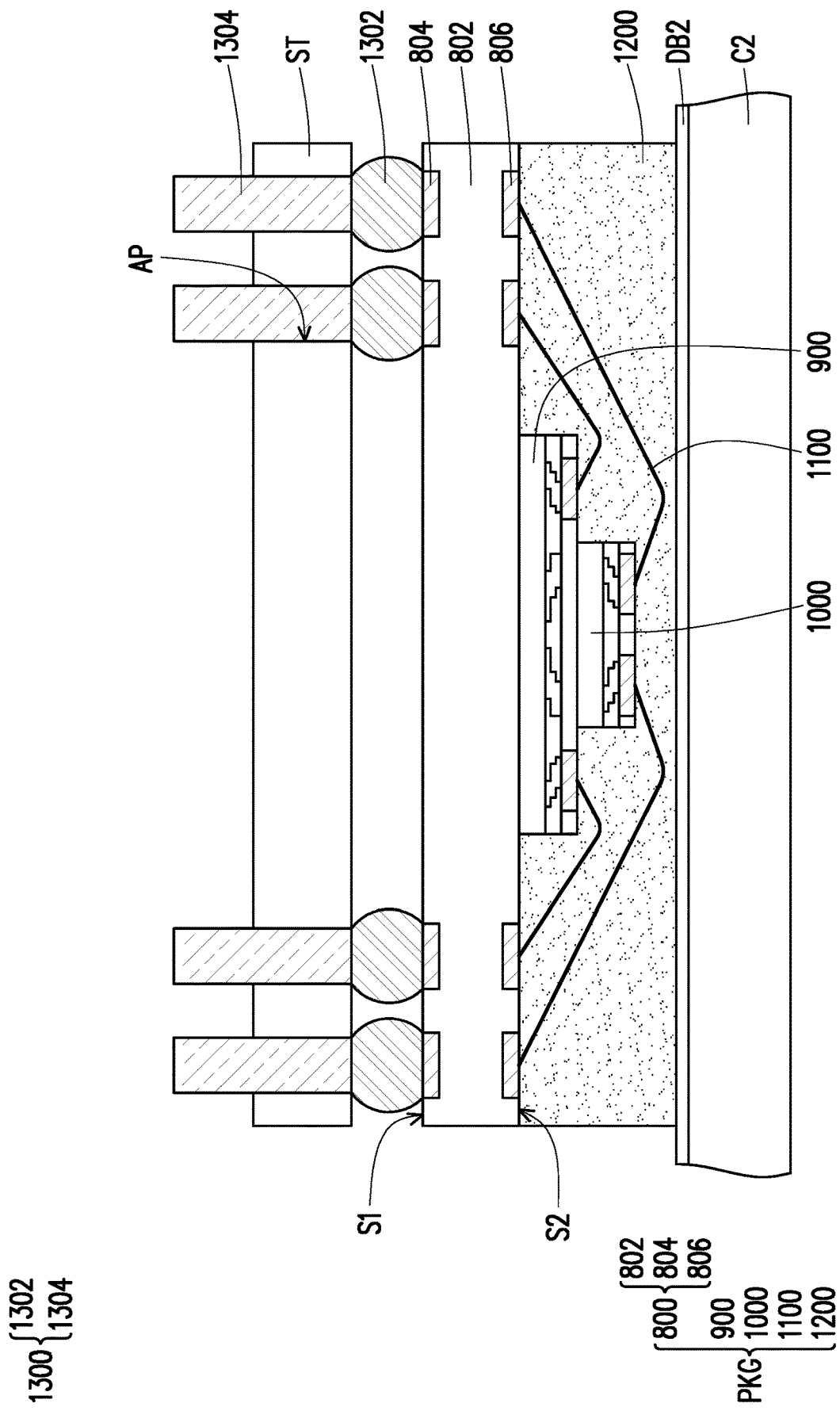

Referring to FIG. 2B, a plurality of conductive features 1304 is formed on the conductive features 1302. In some embodiments, the conductive features 1304 are formed by the following steps. First, a stencil ST is provided over the package structure PKG and the conductive features 1302. In some embodiments, the stencil ST has a plurality of apertures AP, and each aperture AP exposes the corresponding conductive feature 1302. After the stencil ST is provided, a plurality of conductive features 1304 is placed over the stencil ST. Thereafter, a scraper (not shown) is provided over the stencil ST to scrape the conductive features 1304 into the apertures AP of the stencil ST. For example, the conductive features 1304 are able to roll on an upper surface of the stencil ST, and the scraper may easily drive the conductive features 1304 into the apertures AP of the stencil ST. The foregoing process allows the conductive features 1304 to land on the conductive features 1302. Thereafter, a reflow process is performed to fix the conductive features 1304 onto the conductive features 1302. It should be noted that the foregoing process merely serves as an exemplary illustration, and the disclosure is not limited thereto. In some alternative embodiments, the scraper may be omitted. For example, the stencil ST may be tilted or vibrated such that the conductive features 1304 fall into the apertures AP due to the gravitational force or vibration without the aid of the scraper. As illustrated in FIG. 2B, a shape of the conductive features 1304 is different from a shape of the conductive features 1302. For example, the conductive features 1304 include conductive pins, conductive posts, conductive pillars, or the like. In some embodiments, the conductive features 1304 are pre-formed. For example, pre-formed conductive pins are placed onto the corresponding conductive features 1302. In some embodiments, a material of the conductive features 1304 is different from the material of the conductive features 1302. For example, the material of the conductive features 1304 includes copper, aluminum, titanium, nickel, tungsten, alloys thereof, or the like. In some embodiments, a height of each conductive feature 1304 ranges from about 60 µm to about 180 µm. On the other hand, a width/diameter of each conductive feature 1304 ranges from about 50 µm to about 200 µm.

In some embodiments, each conductive feature 1302 and each conductive feature 1304 are collectively referred to as a conductive structure 1300. For example, the conductive feature 1302 may be referred to as a first portion of the conductive structure 1300 while the conductive feature 1304 may be referred to as a second portion of the conductive structure 1300. As illustrated in FIG. 2B, the first portion of the conductive structure 1300 is connected to the second portion of the conductive structure 1300. Moreover, as mentioned above, since the material of the first portion (i.e. the conductive feature 1302) is different from the material of the second portion (i.e. the conductive feature 1304), an interface exists between the first portion and the second portion of the conductive structure 1300. Furthermore, as mentioned above, the shape of the first portion (i.e. the conductive feature 1302) is different from the shape of the second portion (i.e. the conductive feature 1304). Therefore, in some embodiments, a maximum width of the first portion is different from a maximum width of the second portion. For example, as illustrated in FIG. 2B, the maximum width/diameter of the first portion (i.e. the conductive feature 1302) is larger than the maximum width/diameter of the second portion (i.e. the conductive features 1304).

Figure 2C:
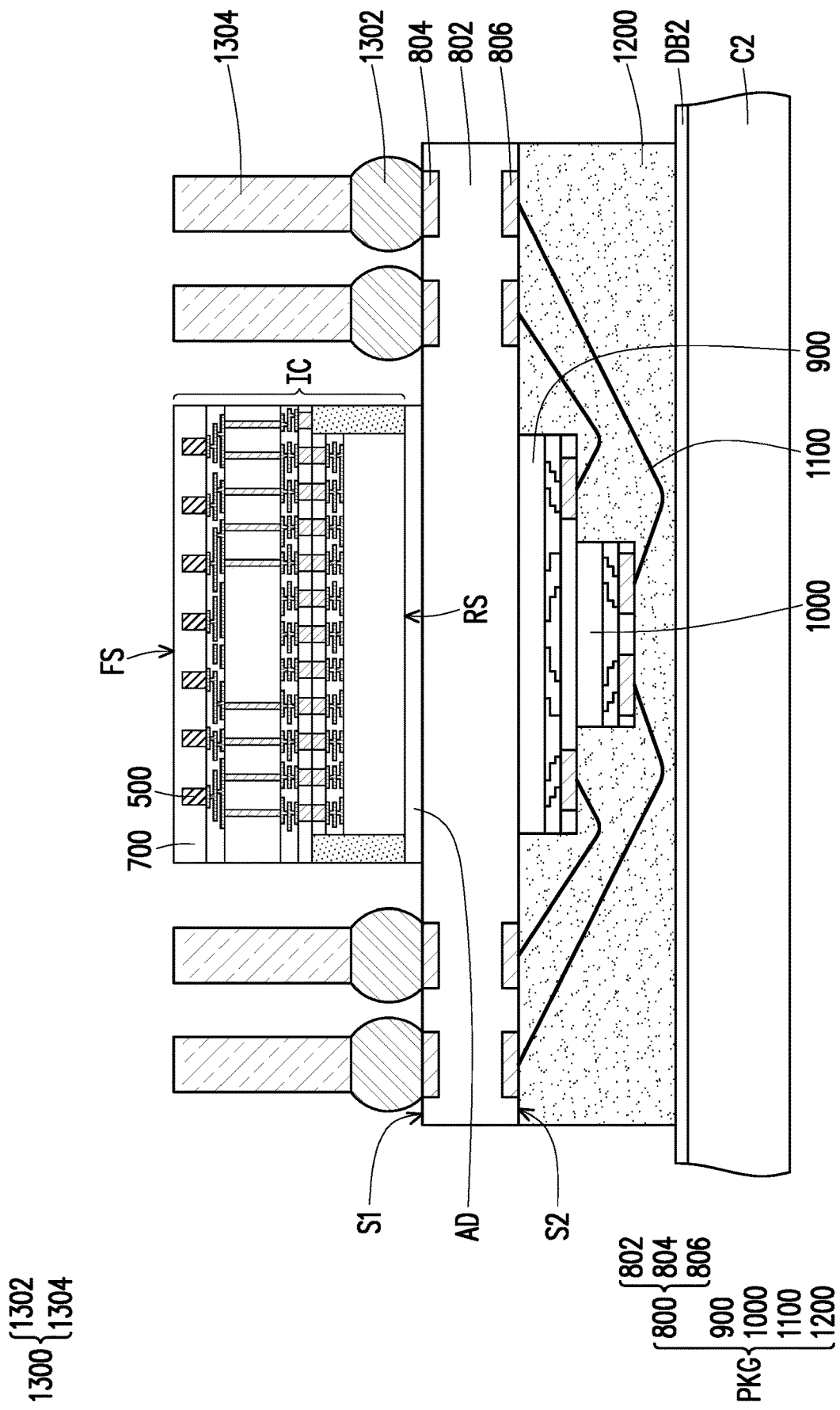

Referring to FIG. 2C, the integrated circuit IC illustrated in FIG. 1H is attached to the package structure PKG. In some embodiments, the integrated circuit IC is attached to the package structure PKG through an adhesive layer AD. For example, the adhesive layer AD may be formed on the rear surface RS of the integrated circuit IC. Thereafter, the integrated circuit IC having the adhesive layer AD formed thereon is picked-and-placed onto the package structure PKG such that the adhesive layer AD is sandwiched between the package structure PKG and the rear surface RS of the integrated circuit IC. In some embodiments, the adhesive layer AD includes die attach film (DAF) or thermal interface material (TIM). In some embodiments, the TIM includes grease-based materials, phase change materials, gels, adhesives, polymeric, metallic materials, or a combination thereof. In some embodiments, the TIM includes lead-tin based solder (PbSn), silver paste (Ag), gold, tin, gallium, indium, or other suitable thermally conductive materials. Depending on the type of material used, the TIM may be formed by deposition, lamination, printing, plating, or any other suitable technique. In some embodiments, the TIM is a gel type material. In some embodiments, the TIM is a film type material (e.g., carbon nanotubes or graphite).

In some embodiments, the integrated circuit IC is placed such that the conductive structures 1300 surround the integrated circuit IC. In other words, the first conductive features 1302 and the second conductive features 1304 surround the integrated circuit IC. Although one integrated circuit IC is illustrated in FIG. 2C, the disclosure is not limited thereto. In some alternative embodiments, more than one integrated circuit IC may be picked-and-placed onto the same package structure PKG.

Figure 2D:
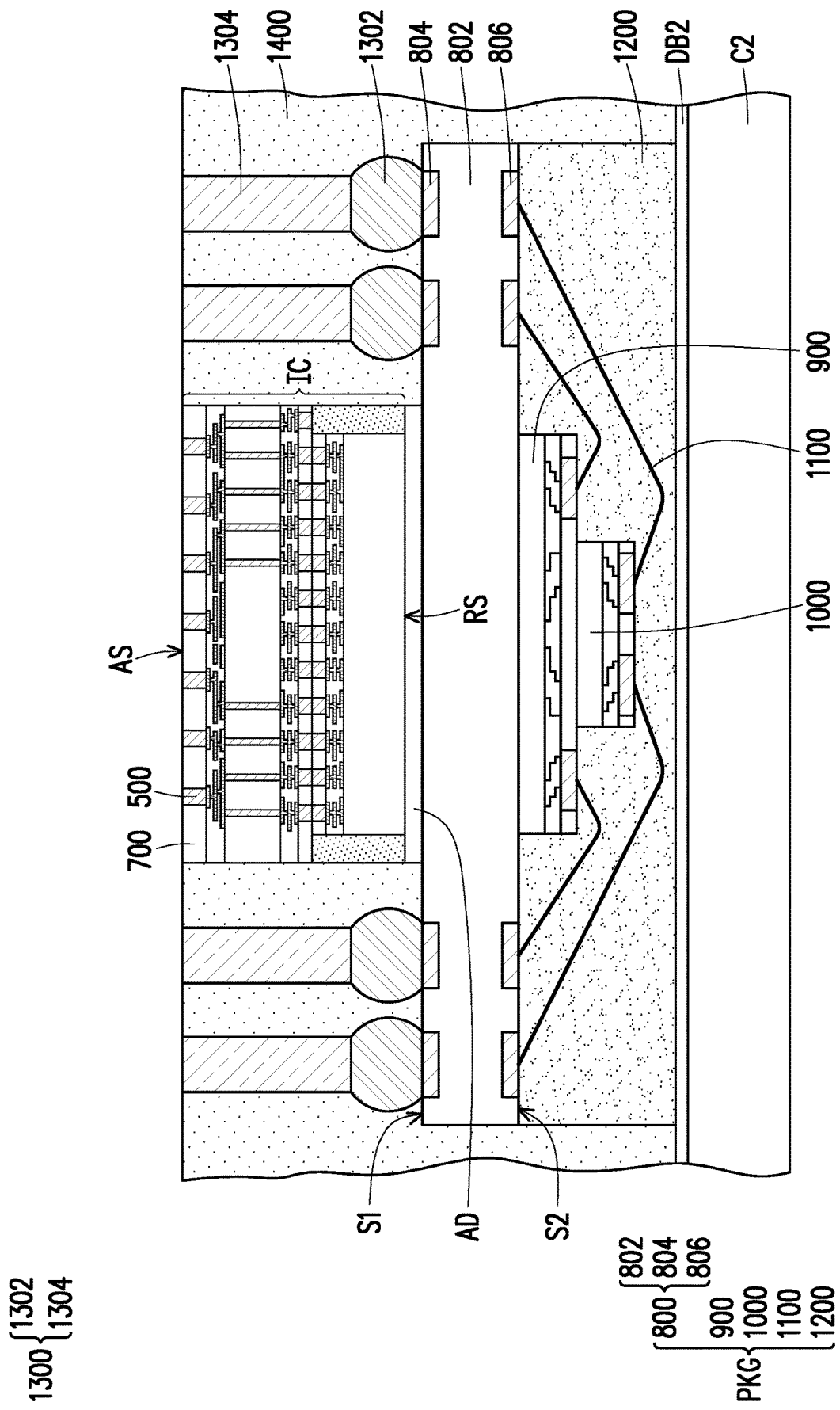

Referring to FIG. 2D, an encapsulant 1400 is formed on the carrier C2 and the de-bonding layer DB2 to laterally encapsulate the package structure PKG, the adhesive layer AD, the integrated circuit IC, and the conductive structures 1300. In other words, the package structure PKG, the adhesive layer AD, the integrated circuit IC, the conductive features 1302, and the conductive features 1304 are being encapsulated by the same encapsulant 1400. In some embodiments, the encapsulant 1400 is formed by the following steps. First, an encapsulation material (not shown) is formed over the carrier C2 and the de-bonding layer DB2 to cover the package structure PKG, the adhesive layer, the integrated circuit IC, and the conductive structures 1300. The encapsulation material is a molding compound, a molding underfill, a resin (such as epoxy), or the like. In some embodiments, the encapsulation material further includes fillers embedded therein to enhance the mechanical strength thereof. The fillers include, for example, particles of $Al_2O_3$, $SiO_2$, $TiO_2$, and/or the like. The encapsulation material may be formed by a molding process, such as a compression molding process. After the encapsulation material is formed, the encapsulation material and the protection layer 700 of the integrated circuit IC are grinded until top surfaces of the conductive structures 1300 (i.e. top surfaces of the conductive features 1304) and top surfaces of the conductive vias 500 are exposed. In some embodiments, the encapsulation material is grinded by a mechanical grinding process and/or a CMP process. In some embodiments, during the grinding process of the encapsulation material and the protection layer 700, portions of the conductive vias 500 and portions of the conductive structures 1300 (i.e. portions of the conductive features 1304) are slightly grinded as well. As illustrated in FIG. 2D, the top surfaces of the conductive structures 1300, the top surface of the protection layer 700, and the top surfaces of the conductive vias 500 are substantially coplanar with a top surface of the encapsulant 1400. In some embodiments, the top surface of the protection layer 700 and the top surfaces of the conductive vias 500 are collectively referred to as the active surface AS of the integrated circuit IC. That is, the active surface AS of the integrated circuit IC is opposite to the rear surface RS of the integrated circuit IC.

As illustrated in FIG. 2D, a height of the conductive structures 1300 is substantially equal to a sum of a thickness of the adhesive layer AD and a thickness of the integrated circuit IC. That is, a sum of the height of the conductive features 1302 and the height of the conductive features 1304 is substantially equal to the sum of the thickness of the adhesive layer AD and the thickness of the integrated circuit IC.

Figure 2E:
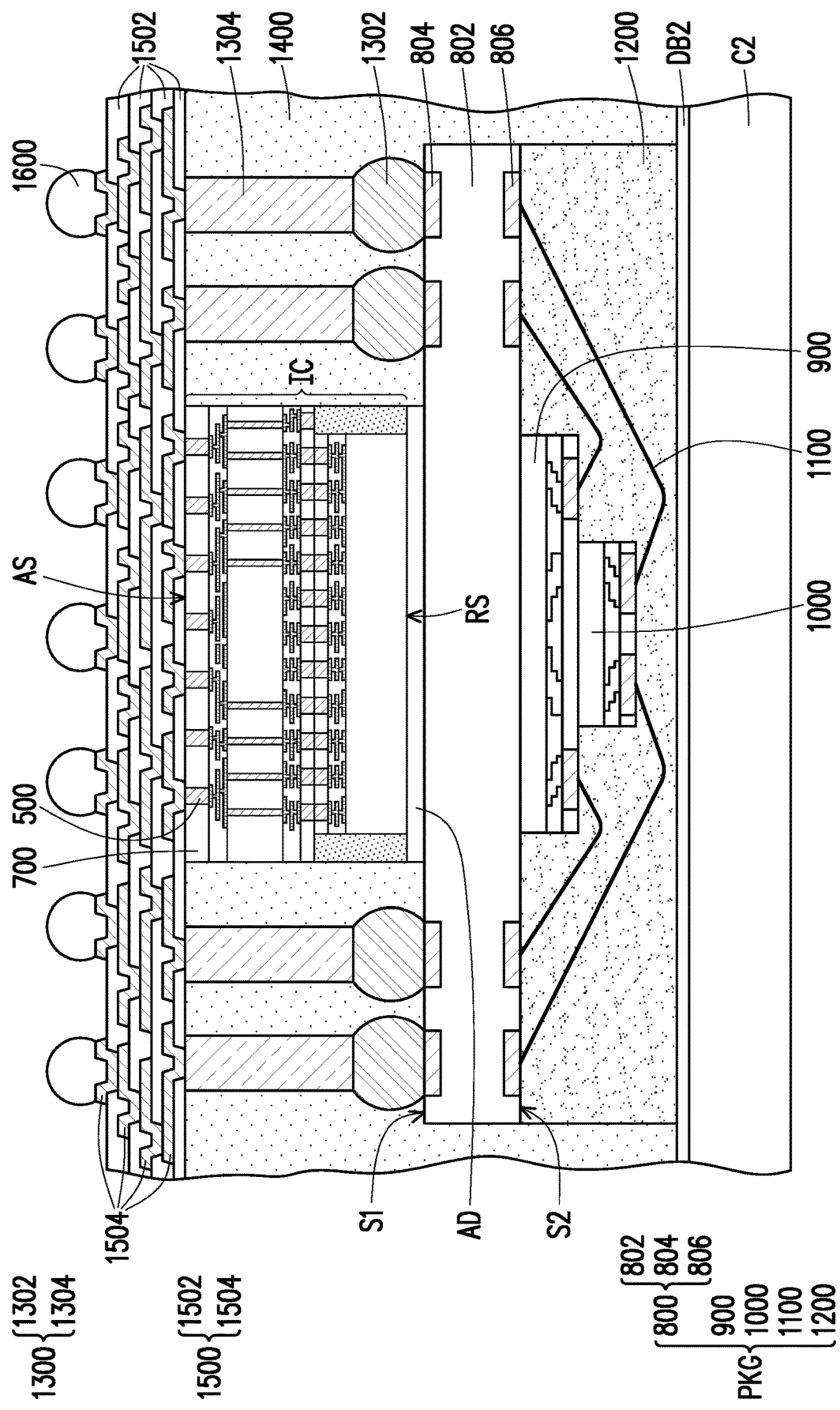

Referring to FIG. 2E, a redistribution structure 1500 and a plurality of conductive terminals 1600 are sequentially formed over the integrated circuit IC, the conductive structures 1300, and the encapsulant 1400. For example, the redistribution structure 1500 is disposed on the encapsulant 1400, the conductive features 1304, and the active surface AS of the integrated circuit IC. In some embodiments, the redistribution structure 1500 is electrically connected to the conductive vias 500 of the integrated circuit IC and the conductive structures 1300. The redistribution structure 1500 includes a plurality of inter-dielectric layers 1502 and a plurality of redistribution conductive patterns 1504 stacked alternately. The redistribution conductive patterns 1504 are electrically connected to the conductive vias 500 of the integrated circuit IC and the conductive structures 1300 embedded in the encapsulant 1400. In some embodiments, the bottommost inter-dielectric layer 1502 has a plurality of contact openings exposing the top surfaces of the conductive vias 500 and the top surfaces of the conductive structures 1300 (i.e. the top surfaces of the conductive features 1304).

The bottommost redistribution conductive patterns 1504 extend into the contact openings of the bottommost inter-dielectric layer 1502 to be in physical contact with the top surfaces of the conductive vias 500 and the top surfaces of the conductive structures 1300 (i.e. the top surfaces of the conductive features 1304).

As illustrated in FIG. 2E, the topmost redistribution conductive patterns 1502 include a plurality of pads. In some embodiments, the aforementioned pads include a plurality of under-ball metallurgy (UBM) patterns for ball mount. In some embodiments, a material of the redistribution conductive patterns 1504 includes aluminum, titanium, copper, nickel, tungsten, and/or alloys thereof. The redistribution conductive patterns 1504 may be formed by, for example, electroplating, deposition, and/or photolithography and etching. In some embodiments, a material of the inter-dielectric layers 1502 includes polyimide, epoxy resin, acrylic resin, phenol resin, BCB, PBO, or other suitable polymer-based dielectric materials. The inter-dielectric layers 1502 may be formed by suitable fabrication techniques such as spin-on coating, CVD, PECVD, or the like.

In some embodiments, the conductive terminals 1600 are disposed on the redistribution structure 1500. For example, the conductive terminals 1600 are placed on the topmost redistribution conductive patterns 1504 (the UBM patterns) of the redistribution structure 1500. In some embodiments, the conductive terminals 1600 include solder balls. In some embodiments, the conductive terminals 1600 may be placed on the UBM patterns through a ball placement process or other suitable processes.

Figure 2F:
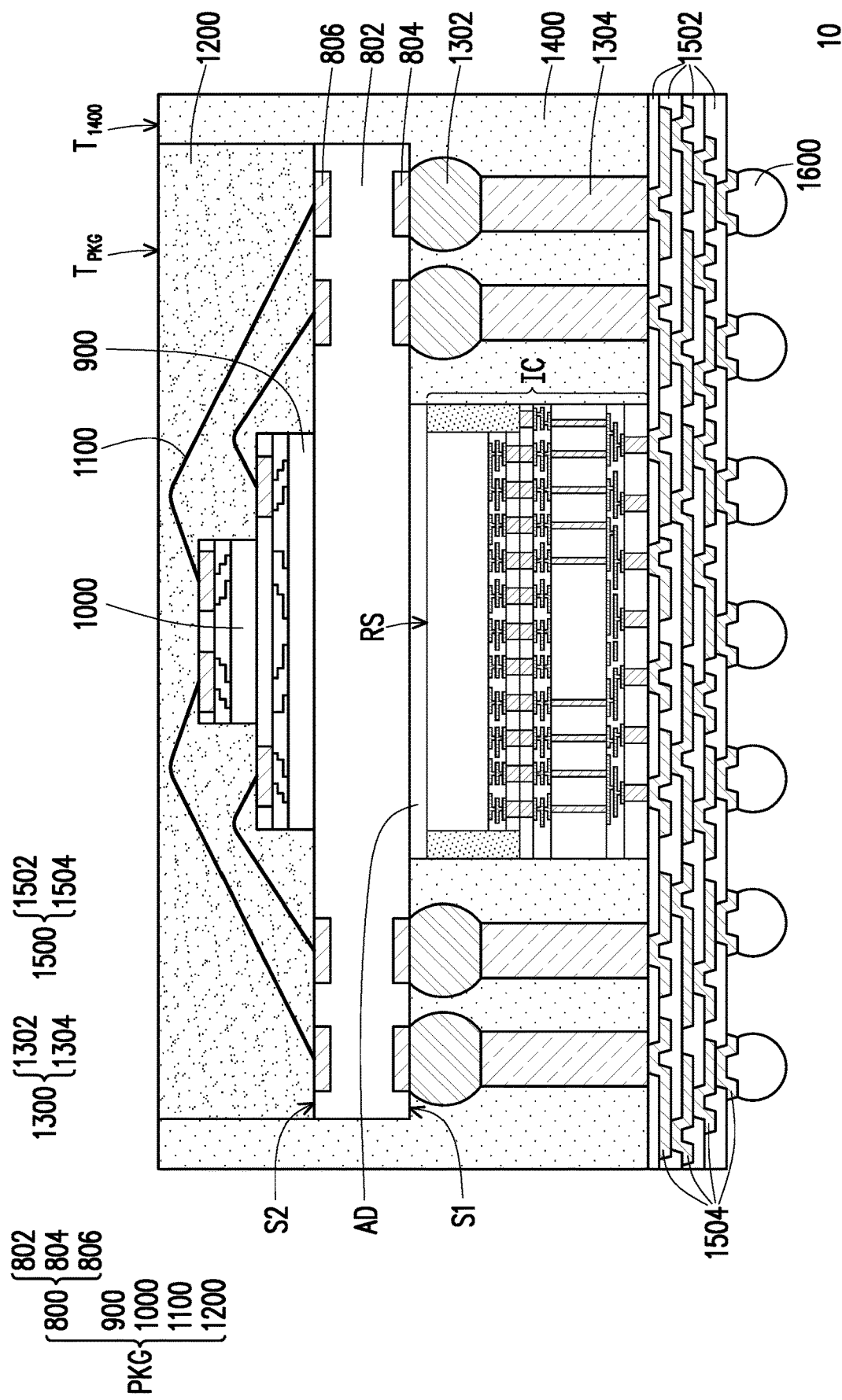

Referring to FIG. 2E and FIG. 2F, the package structure PKG and the encapsulant 1400 are de-bonded from the de-bonding layer DB2 such that the package structure PKG and the encapsulant 1400 are separated from the carrier C2. In some embodiments, the de-bonding layer DB2 (e.g., the LTHC release layer) is irradiated by an UV laser such that the de-bonding layer DB2 and the carrier C2 may be peeled off from the package structure PKG and the encapsulant 1400. Subsequently, the structure is flipped upside down and a singulation process is performed to obtain a plurality of semiconductor devices 10. In some embodiments, the singulation process typically involves dicing with a rotating blade or a laser beam. In other words, the singulation process is, for example, a laser cutting process, a mechanical cutting process, or other suitable processes.

As illustrated in FIG. 2F, the semiconductor device 10 includes the integrated circuit IC, the conductive structures 1300, the encapsulant 1400, the adhesive layer AD, the package structure PKG, the redistribution structure 1500, and the conductive terminals 1600. In some embodiments, the conductive structures 1300 are disposed to surround the integrate circuit IC. Meanwhile, the package structure PKG is disposed over the conductive structure 1300 (i.e. the conductive features 1302 and the conductive features 1304) and the rear surface RS of the integrated circuit IC. In some embodiments, the package structure PKG is attacked to the integrated circuit IC through the adhesive layer AD. As illustrated in FIG. 2F, the redistribution structure 1500 and the package structure PKG are on opposite sides of the integrated circuit IC and the conductive structures 1300. The encapsulant 1400 is disposed on the redistribution structure 1500 to encapsulate the integrated circuit IC, the conductive structures 1300, the adhesive layer AD, and the package structure PKG. As illustrated in FIG. 2F, a top surface $T_{1400}$ of the encapsulant 1400 is coplanar with a top surface $T_{PKG}$ of the package structure PKG. In other words, the encapsulant 1400 completely covers each sidewall of the package structure PKG. In some embodiments, the conductive terminals 1600 are disposed on the redistribution structure 1500 opposite to the integrated circuit IC, the conductive structure 1300, and the encapsulant 1400.

In some embodiments, each conductive structure 1300 includes the conductive feature 1302 and the conductive feature 1304 formed in different steps. Since the conductive features 1304 are pre-formed, the fabrication cost may be sufficiently reduced. Moreover, since the package structure PKG is embedded within the encapsulant 1400, the compactness of the semiconductor device 10 may be enhanced and the form factor may be reduced. Furthermore, since the integrated circuit IC is attached to the package structure PKG, heat within the integrated circuit IC generated during operation of the semiconductor device 10 may be effectively dissipated through the heat dissipation route provided by the package structure PKG. As such, as compared to conventional structure where an air gap exists between the integrated circuit IC and the package structure PKG, the heat dissipation rate of the semiconductor device 10 may be sufficiently increased.

Figure 3A:
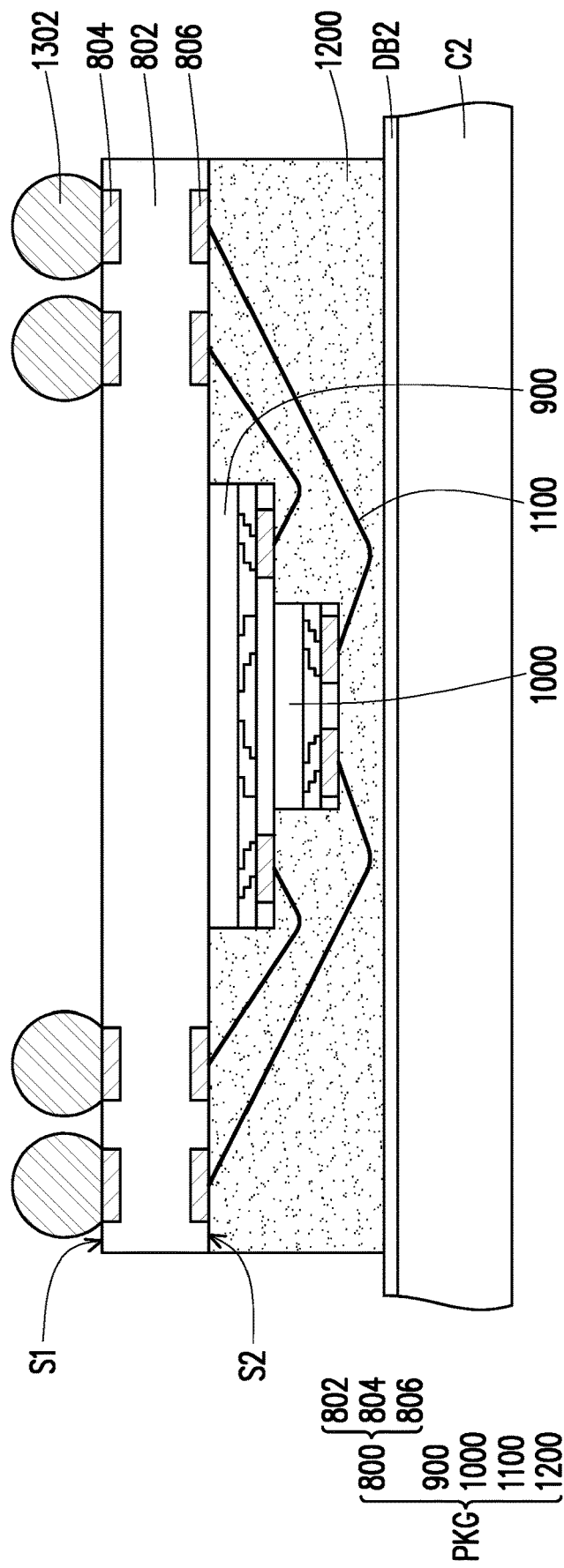
FIG. 3A to FIG. 3F are schematic cross-sectional views illustrating a manufacturing process of a semiconductor device in accordance with some alternative embodiments of the disclosure.

FIG. 3A to FIG. 3F are schematic cross-sectional views illustrating a manufacturing process of a semiconductor device 20 in accordance with some alternative embodiments of the disclosure. Referring to FIG. 3A, a carrier C2 having a de-bonding layer DB2 formed thereon is provided. Thereafter, a plurality of package structures PKG is disposed on the carrier C2. For simplicity, one package structure PKG is shown in FIG. 3A. Subsequently, a plurality of conductive features 1302 is formed on the package structures PKG. The carrier C2, the de-bonding layer DB2, the package structures PKG, and the conductive features 1302 in FIG. 3A are respectively similar to the carrier C2, the de-bonding layer DB2, the package structures PKG, and the conductive features 1302 in FIG. 2A, so the detailed descriptions thereof are omitted herein.

Figure 3B:
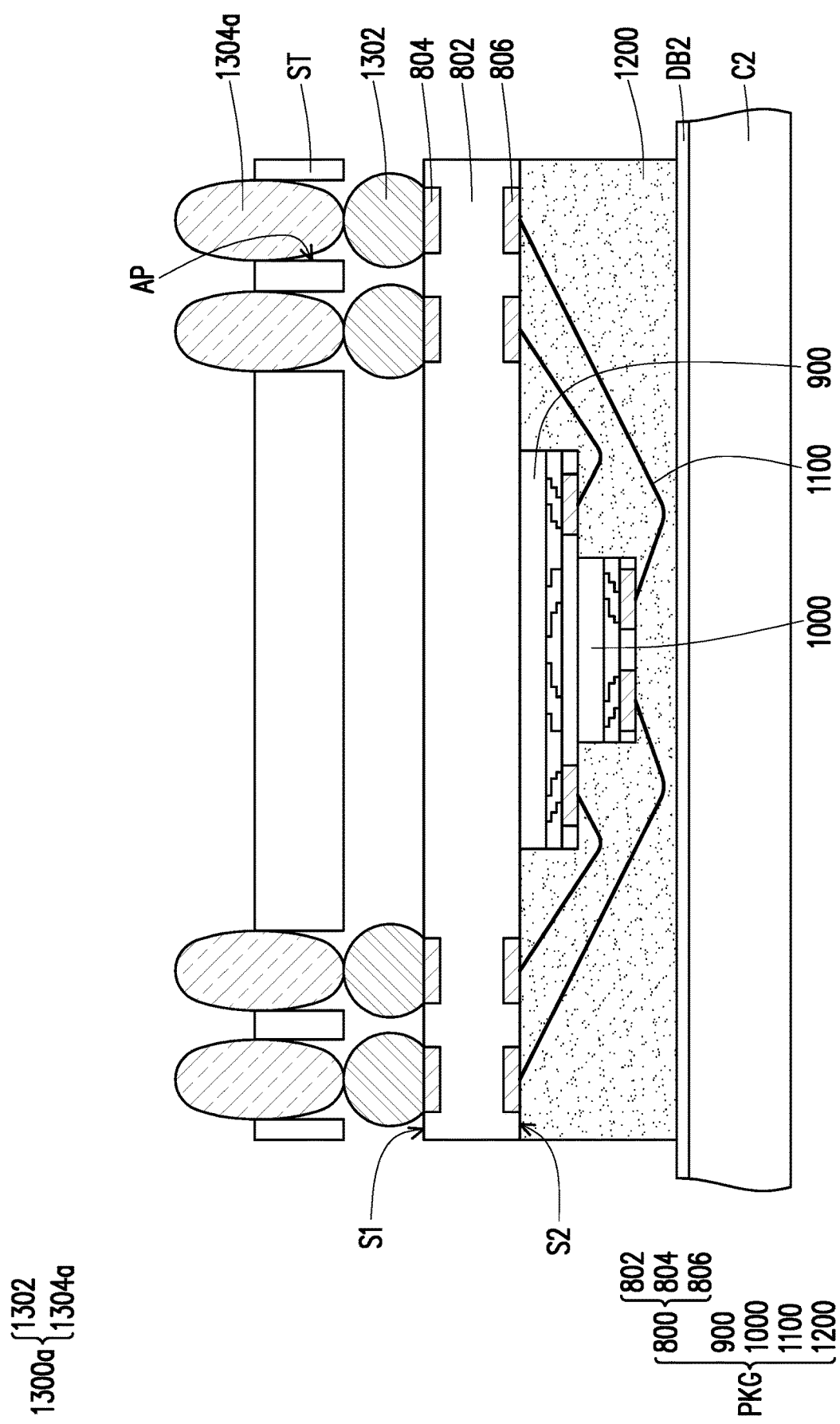

Referring to FIG. 3B, a plurality of conductive features 1304a is formed on the conductive features 1302. The formation method and the material of the conductive features 1304a in FIG. 3B are similar to the conductive features 1304 in FIG. 2B, so the detailed descriptions thereof are omitted herein. In some embodiments, the conductive features 1304a include conductive ball, conductive bumps, or the like. In some embodiments, the conductive features 1304a are elliptical. However, the disclosure is not limited thereto. In some alternative embodiments, the conductive features 1304a are spherical. When the conductive features 1304a are elliptical, a shape of the conductive features 1304a and the shape of the conductive features 1302 are different. When the conductive features 1304a are spherical, the shape of the conductive features 1304a and the shape of the conductive features 1302 are substantially the same. In some embodiments, the conductive features 1304a are pre-formed. For example, pre-formed conductive balls are placed onto the corresponding conductive features 1302. In some embodiments, a material of the conductive features 1304a is different from the material of the conductive features 1302. For example, the material of the conductive features 1304a includes copper, aluminum, titanium, nickel, tungsten, alloys thereof, or the like. In some embodiments, a height of each conductive feature 1304a ranges from about 60 μm to about 180 μm. On the other hand, a width/diameter of each conductive feature 1304a ranges from about 50 μm to about 200 μm.

In some embodiments, each conductive feature 1302 and each conductive feature 1304a are collectively referred to as a conductive structure 1300a. For example, the conductive feature 1302 may be referred to as a first portion of the conductive structure 1300a while the conductive feature 1304a may be referred to as a second portion of the conductive structure 1300a. As illustrated in FIG. 3B, the first portion of the conductive structure 1300a is connected to the second portion of the conductive structure 1300a. Moreover, as mentioned above, since the material of the first portion (i.e. the conductive feature 1302) is different from the material of the second portion (i.e. the conductive feature 1304a), an interface exists between the first portion and the second portion of the conductive structure 1300a. In some embodiments, a maximum width/diameter of the first portion is different from a maximum width/diameter of the second portion. For example, as illustrated in FIG. 3B, the maximum width/diameter of the first portion (i.e. the conductive feature 1302) is larger than the maximum width/diameter of the second portion (i.e. the conductive features 1304a).

In some embodiments, after the conductive features 1304a are placed onto the conductive features 1302, a reflow process is performed to fix the conductive features 1304a onto the conductive features 1302. It should be noted that after the reflow process, the shape of the conductive features 1302 and the shape of conductive features 1304a remain substantially unchanged. That is, after the reflow process, the conductive features 1302 and the conductive features 1304a are still spherical or elliptical.

Figure 3C:
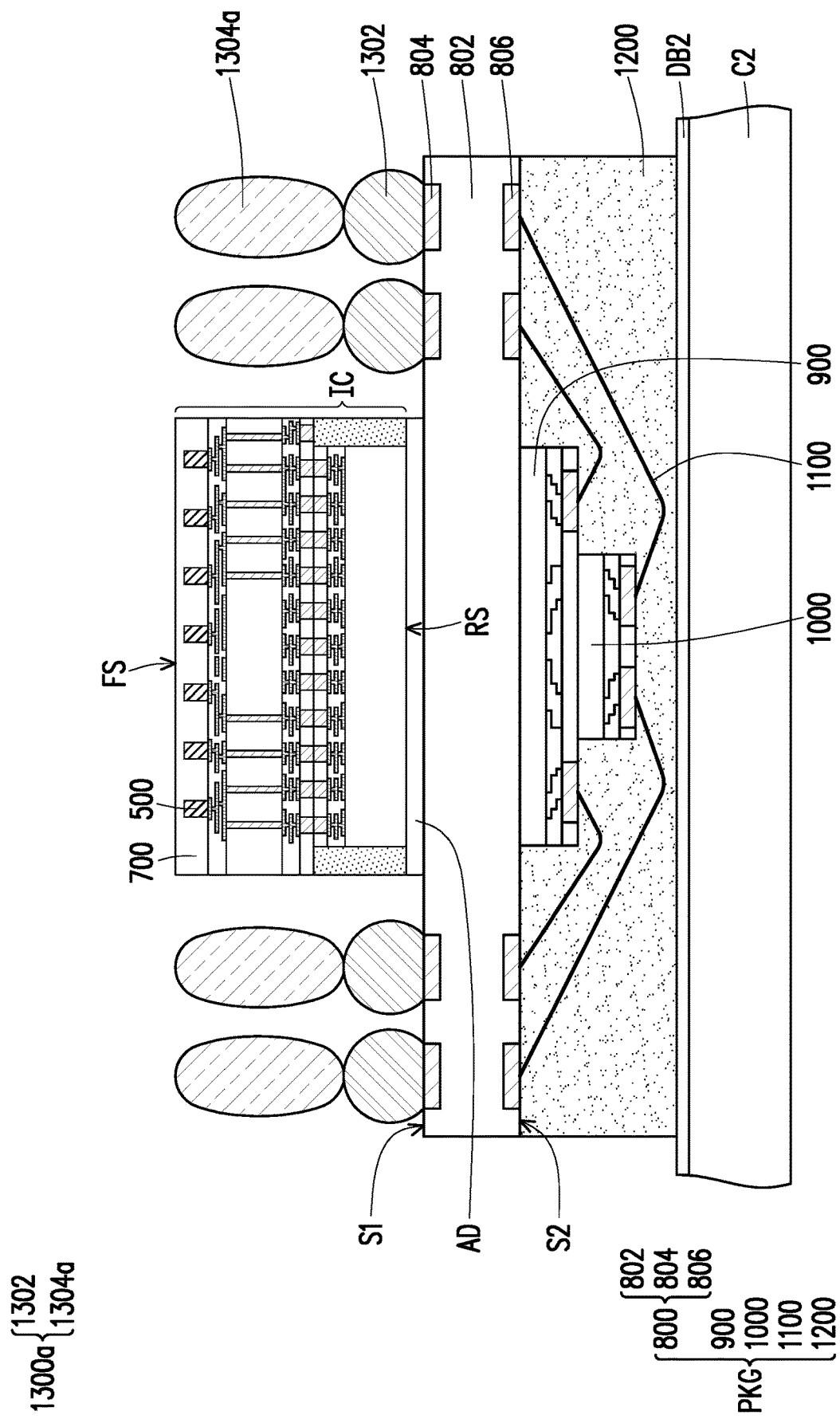

Referring to FIG. 3C, the integrated circuit IC illustrated in FIG. 1H is attached to the package structure PKG through an adhesive layer AD. In some embodiments, the integrated circuit IC and the adhesive layer AD in FIG. 3C are respectively similar to the integrated circuit IC and the adhesive layer AD in FIG. 2C, so the detailed descriptions thereof are omitted herein.

Figure 3D:
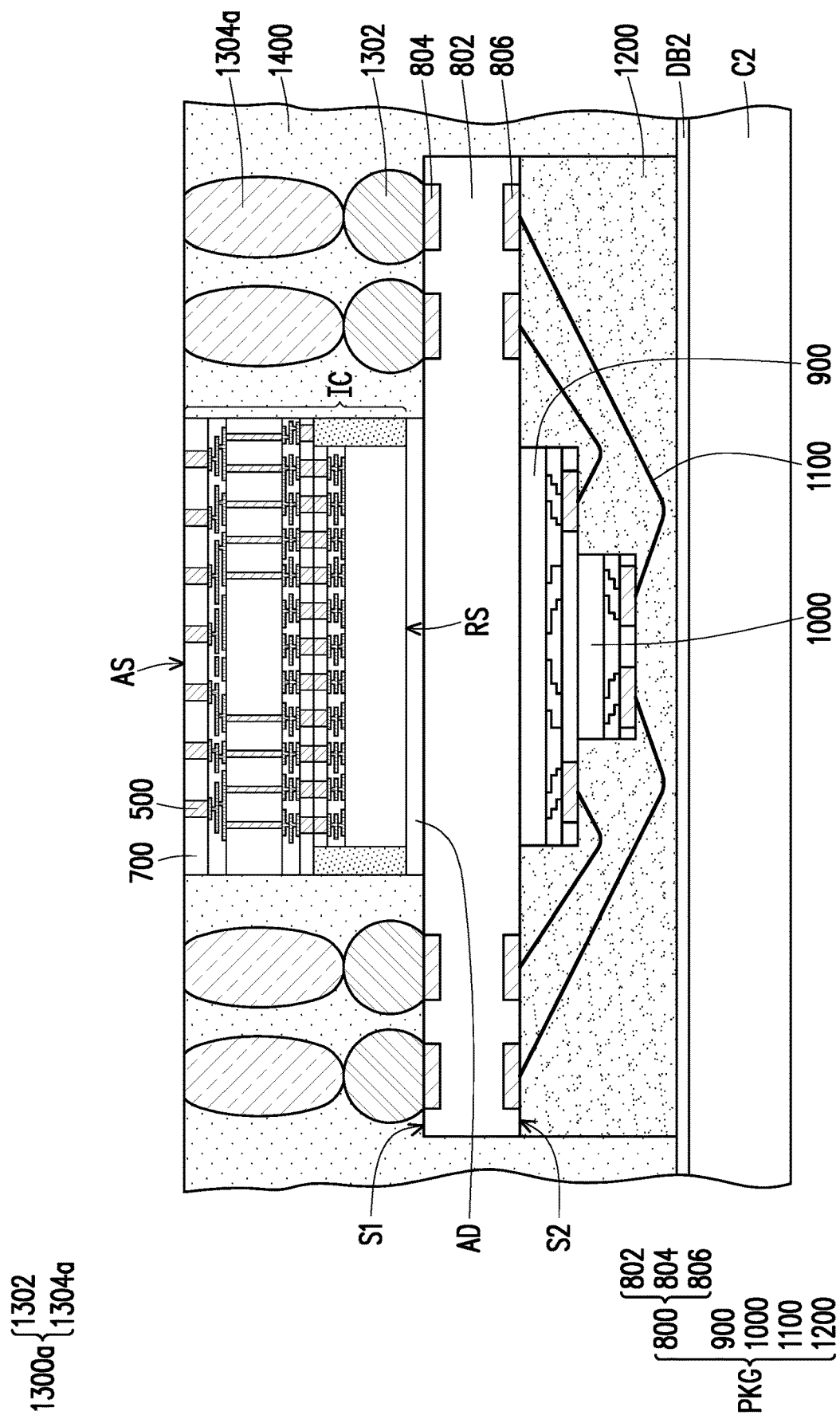

Referring to FIG. 3D, an encapsulant 1400 is formed on the carrier C2 and the de-bonding layer DB2 to laterally encapsulate the package structure PKG, the adhesive layer AD, the integrated circuit IC, and the conductive structures 1300a. In other words, the package structure PKG, the adhesive layer AD, the integrated circuit IC, the conductive features 1302, and the conductive features 1304a are being encapsulated by the same encapsulant 1400. In some embodiments, the encapsulant 1400 in FIG. 3D is similar to the encapsulant 1400 in FIG. 2D, so the detailed description thereof is omitted herein. As illustrated in FIG. 3D, after grinding, top surfaces of the conductive features 1304a are substantially flat. That is, after grinding, the conductive features 1304a are no longer spherical or elliptical.

Figure 3E:
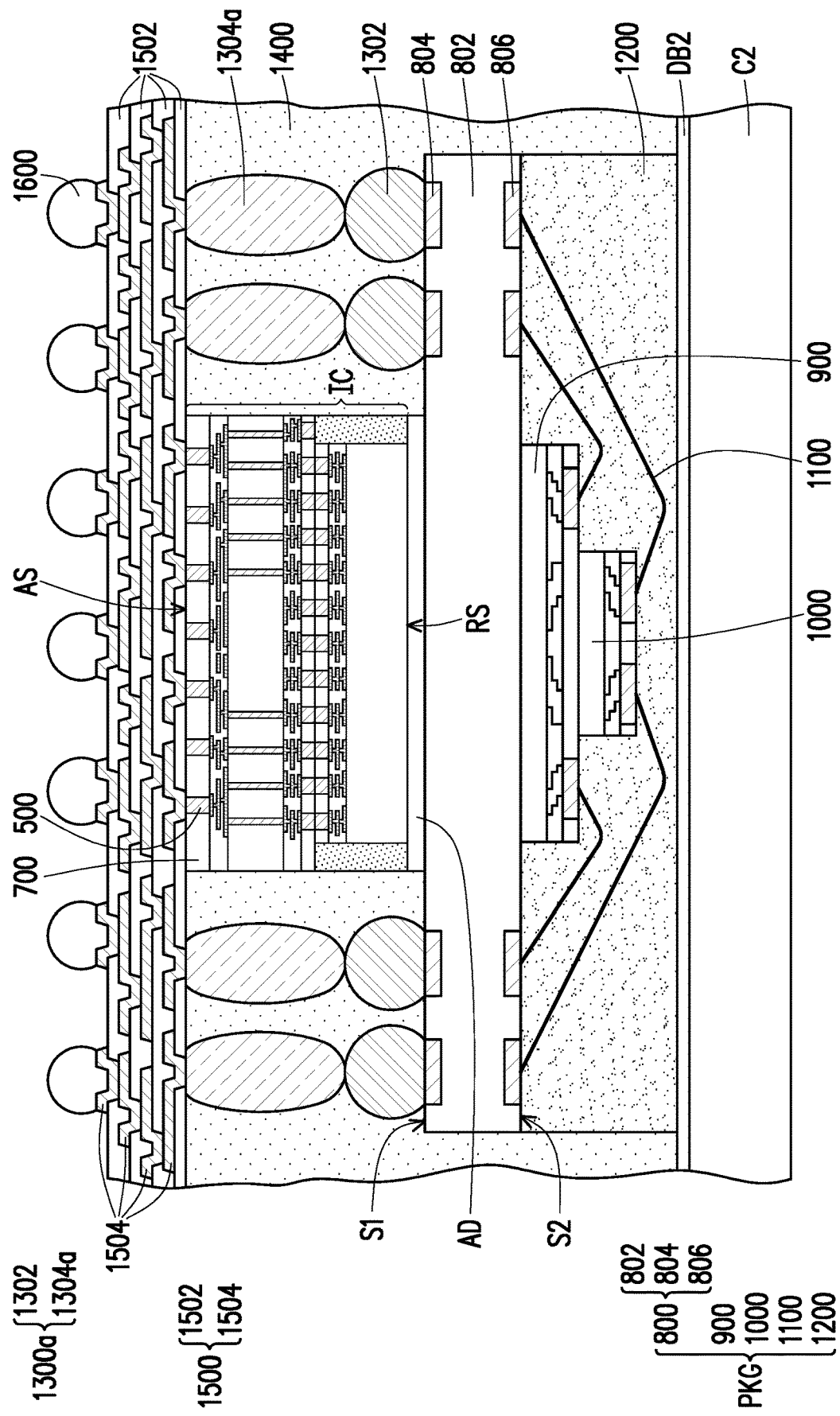

Referring to FIG. 3E, a redistribution structure 1500 and a plurality of conductive terminals 1600 are sequentially formed over the integrated circuit IC, the conductive structures 1300a, and the encapsulant 1400. In some embodiments, the redistribution structure 1500 and the conductive terminals 1600 in FIG. 3E are respectively similar to the redistribution structure 1500 and the conductive terminals 1600 in FIG. 2E, so the detailed descriptions thereof are omitted herein.

Figure 3F:
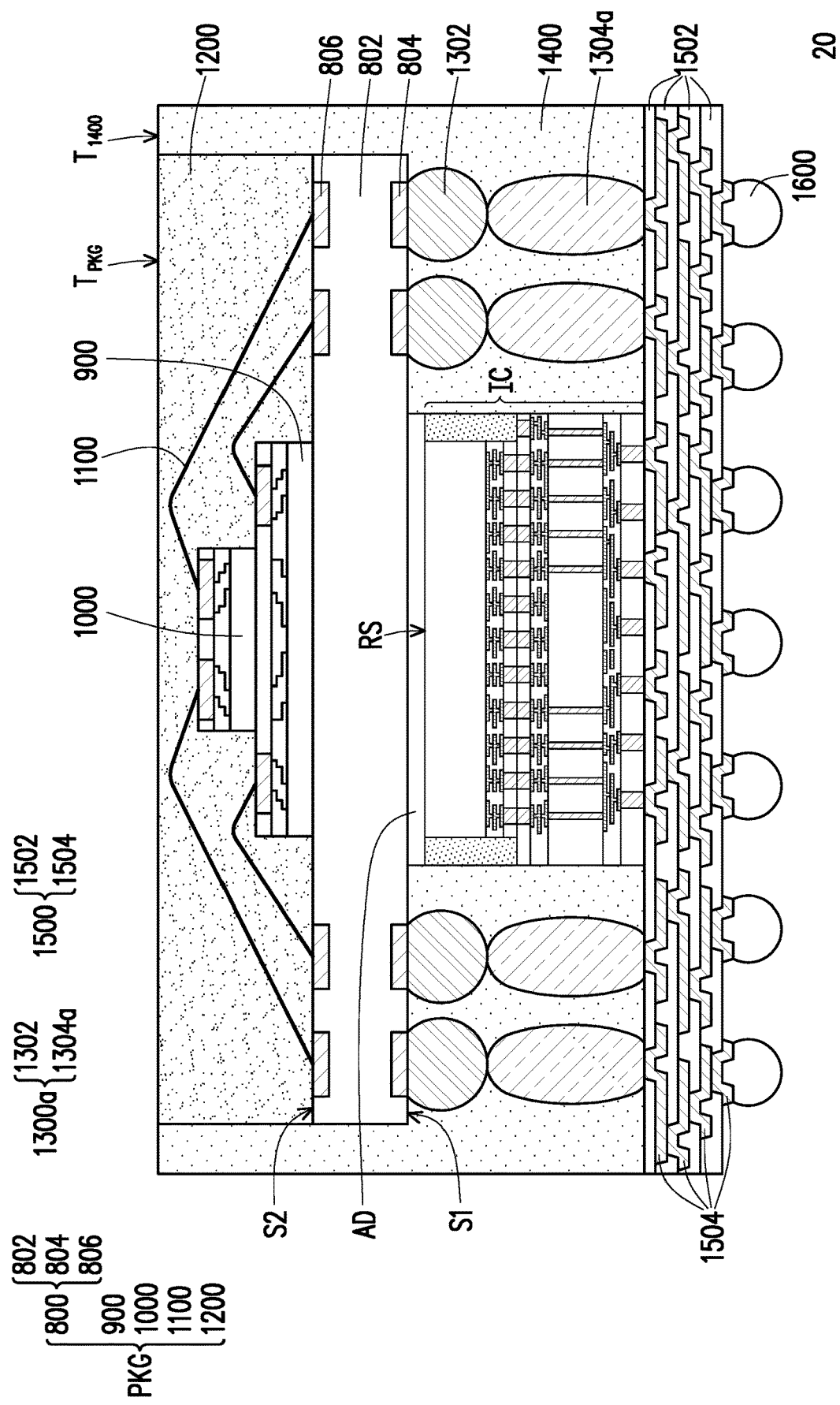

Referring to FIG. 3E and FIG. 3F, the package structure PKG and the encapsulant 1400 are de-bonded from the de-bonding layer DB2 and a singulation process is performed to obtain a plurality of semiconductor devices 20. The step shown in FIG. 3F is similar to the step shown in FIG. 2F, so the detailed description thereof is omitted herein. In some embodiments, each conductive structure 1300a includes the conductive feature 1302 and the conductive feature 1304a formed in different steps. Since the conductive features 1304a are pre-formed, the fabrication cost may be sufficiently reduced. Moreover, since the package structure PKG is embedded within the encapsulant 1400, the compactness of the semiconductor device 20 may be enhanced and the form factor may be reduced. Furthermore, since the integrated circuit IC is attached to the package structure PKG, heat within the integrated circuit IC generated during operation of the semiconductor device 20 may be effectively dissipated through the heat dissipation route provided by the package structure PKG. As such, as compared to conventional structure where an air gap exists between the integrated circuit IC and the package structure PKG, the heat dissipation rate of the semiconductor device 20 may be sufficiently increased.

It should be noted that as illustrated in FIG. 2C and FIG. 2D, the step of forming the conductive features 1304 precedes the step of encapsulating the package structure PKG, the conductive features 1302, the conductive features 1304, and the integrated circuit IC. Similarly, as illustrated in FIG. 3C and FIG. 3D, the step of forming the conductive features 1304a precedes the step of encapsulating the package structure PKG, the conductive features 1302, the conductive features 1304a, and the integrated circuit IC However, such sequence is merely an exemplary illustration of the manufacturing process of the semiconductor devices 10 and 20, and the disclosure is not limited thereto. In some alternative embodiments, other sequence of steps may be adopted, and this other sequence of steps will be described below in conjunction with FIG. 4A to FIG. 4G.

Figure 4A:
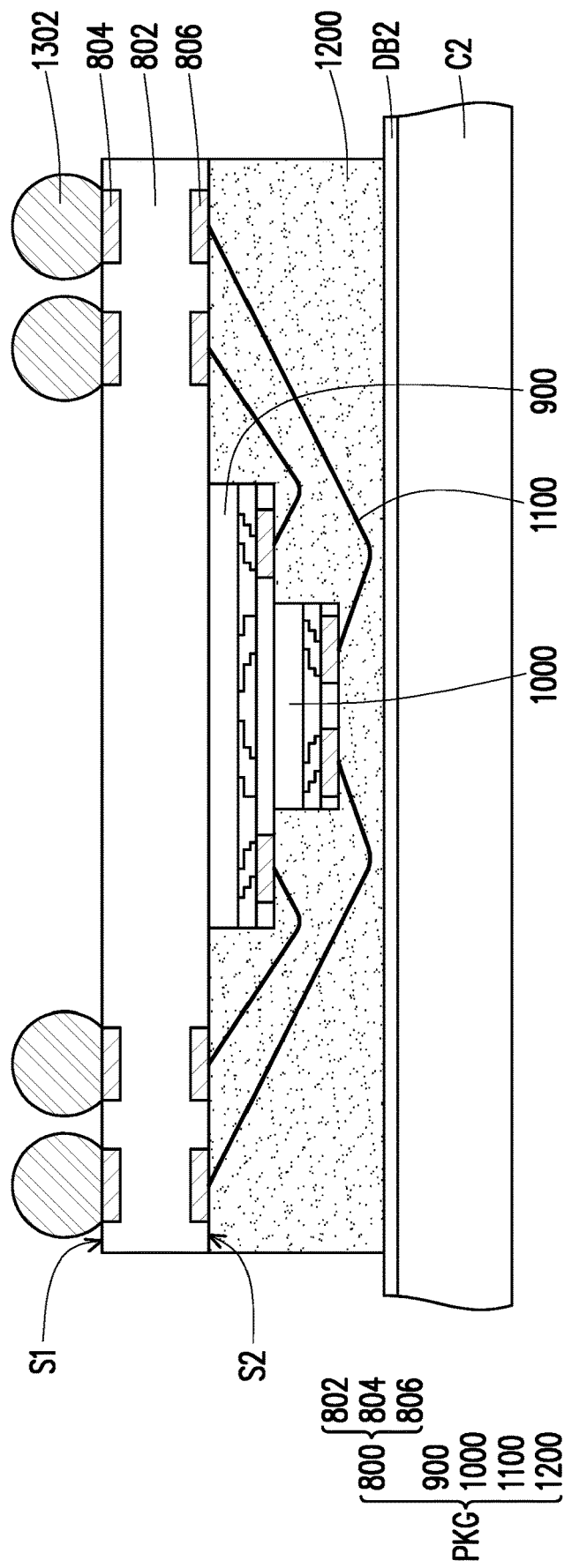

FIG. 4A to FIG. 4G are schematic cross-sectional views illustrating a manufacturing process of a semiconductor device 30 in accordance with some alternative embodiments of the disclosure. Referring to FIG. 4A, a carrier C2 having a de-bonding layer DB2 formed thereon is provided. Thereafter, a plurality of package structures PKG is disposed on the carrier C2. For simplicity, one package structure PKG is shown in FIG. 4A. Subsequently, a plurality of conductive features 1302 is formed on the package structures PKG. The carrier C2, the de-bonding layer DB2, the package structures PKG, and the conductive features 1302 in FIG. 4A are respectively similar to the carrier C2, the de-bonding layer DB2, the package structures PKG, and the conductive features 1302 in FIG. 2A, so the detailed descriptions thereof are omitted herein.

Referring to FIG. 4B, the integrated circuit IC illustrated in FIG. 1H is attached to the package structure PKG through an adhesive layer AD. In some embodiments, the integrated circuit IC and the adhesive layer AD in FIG. 4B are respectively similar to the integrated circuit IC and the adhesive layer AD in FIG. 2C, so the detailed descriptions thereof are omitted herein.

Figure 4C:
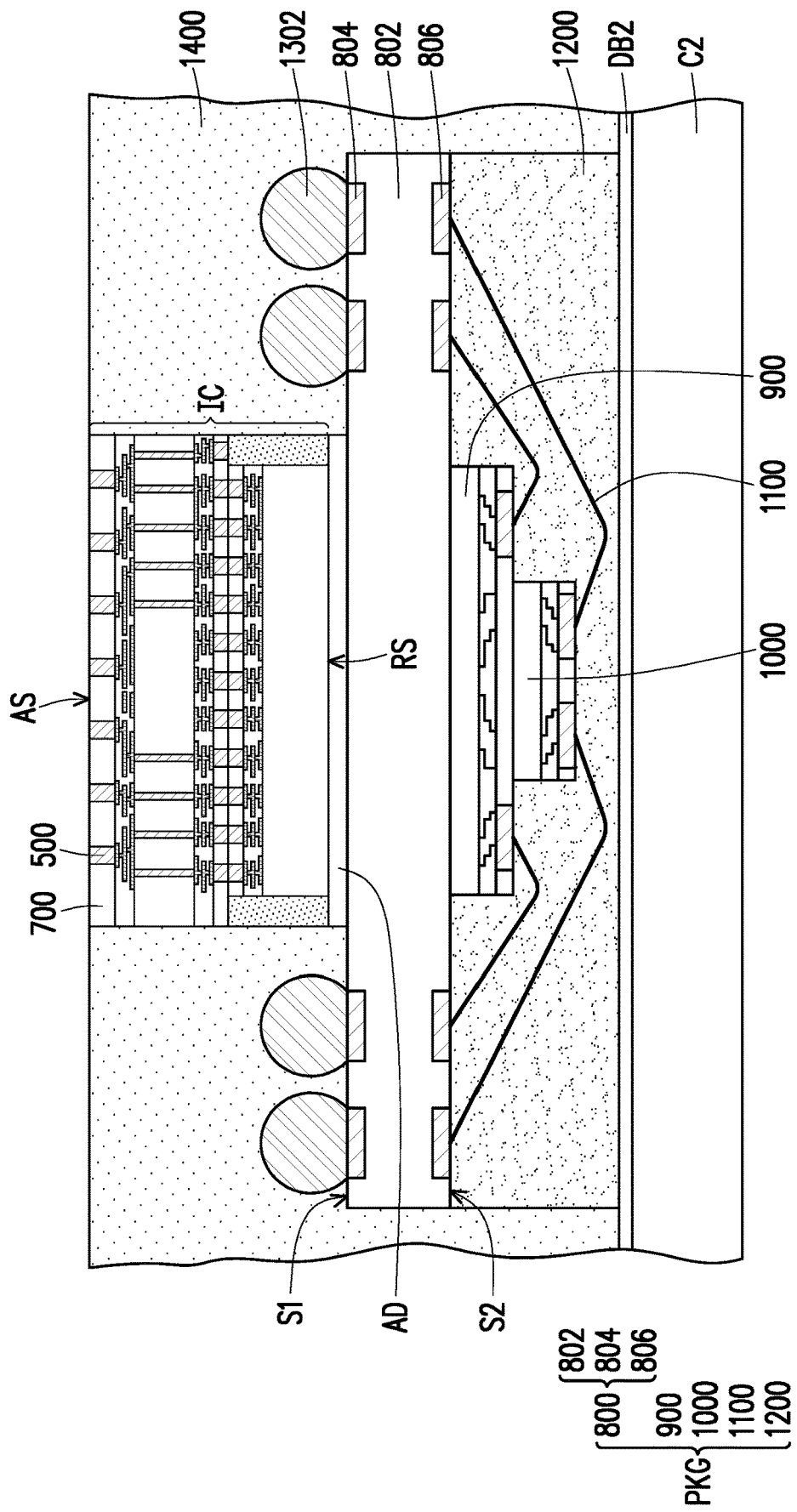

Referring to FIG. 4C, an encapsulant 1400 is formed on the carrier C2 and the de-bonding layer DB2 to laterally encapsulate the package structure PKG, the adhesive layer AD, the integrated circuit IC, and the conductive features 1302. In some embodiments, the encapsulant 1400 in FIG. 4C is similar to the encapsulant 1400 in FIG. 2D, so the detailed description thereof is omitted herein.

Figure 4D:
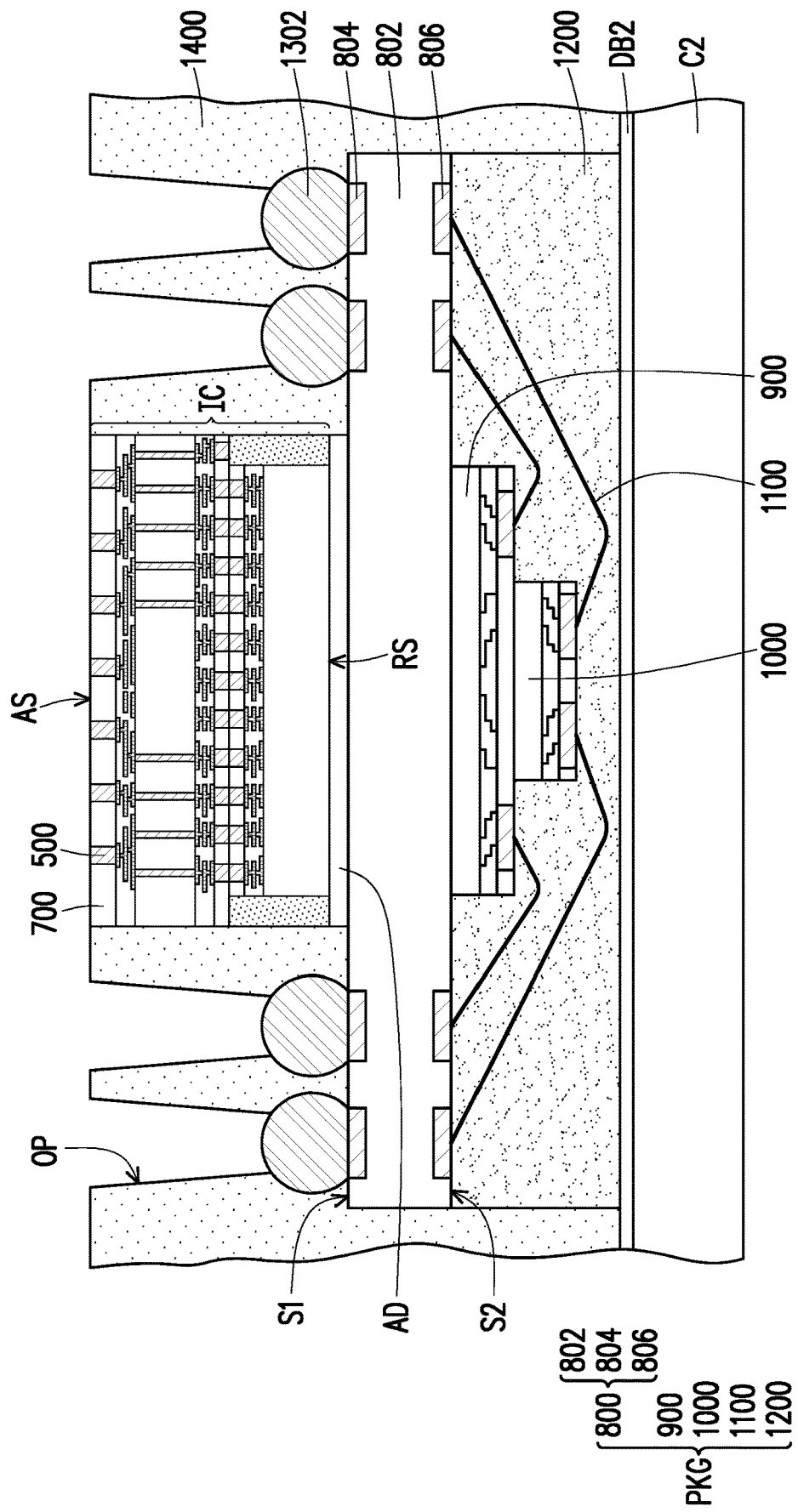

Referring to FIG. 4D, a plurality of openings OP is formed in the encapsulant 1400. In some embodiments, the openings OP partially expose each of the conductive features 1302. For example, top surfaces of the conductive features 1302 are partially exposed by the openings OP of the encapsulant 1400. The openings OP may be formed by, for example, laser drilling, mechanical drilling, etching, or the like. As illustrated in FIG. 4D, each opening OP has a slanted sidewall. That is, each opening OP may be in the form of a conical frustum. However, the disclosure is not limited thereto. In some alternative embodiments, each opening OP may have a substantially straight sidewall, and each opening OP may be in the form of a cylinder.

Figure 4E:
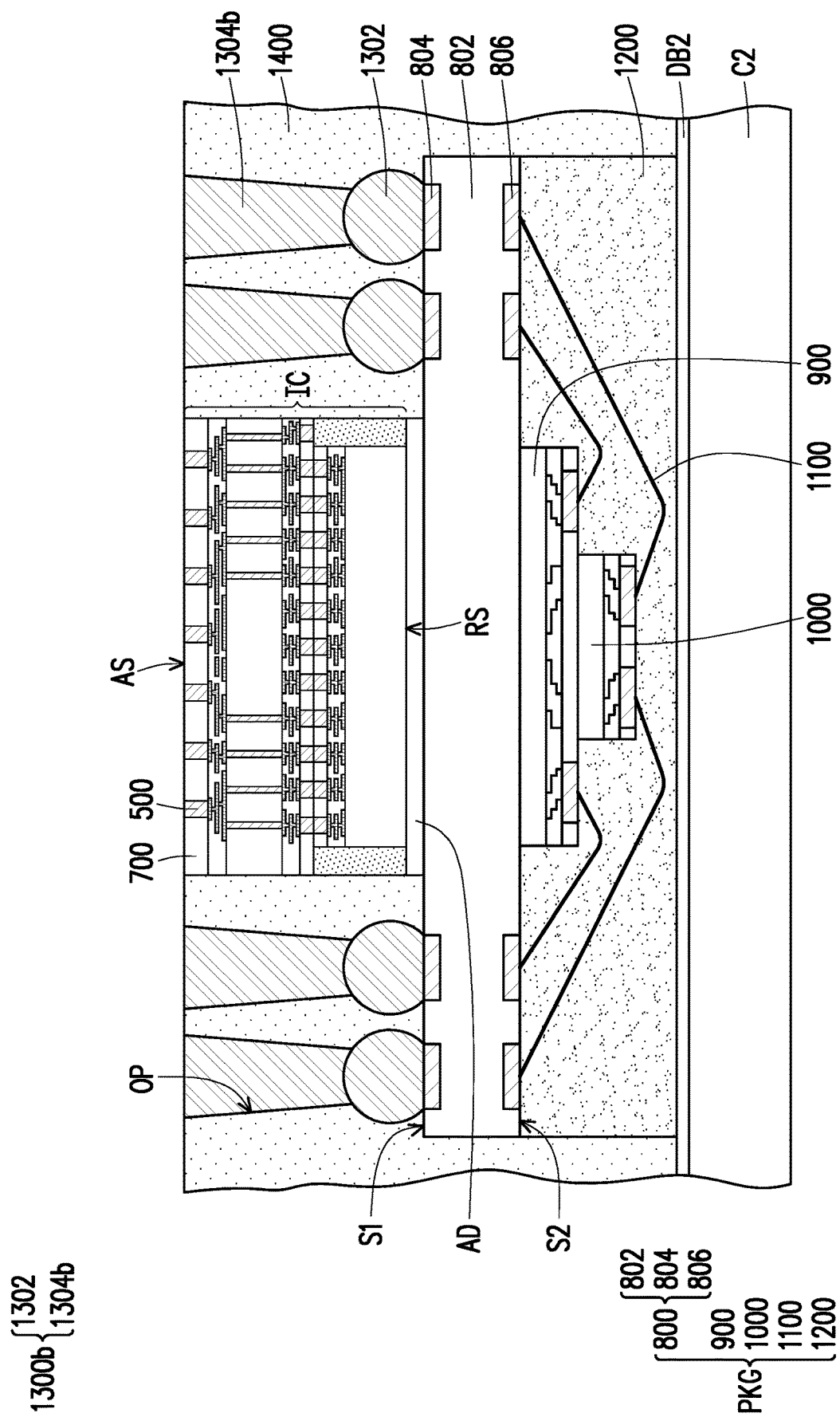

Referring to FIG. 4E, a conductive paste is filled into the openings OP and a curing process is performed to form conductive features 1304b. In some embodiments, the conductive paste includes solder paste (pre-solder) or the like. As illustrated in FIG. 4E, top surfaces of the conduvice features 1304b are substantially coplanar with a top surface of the encapsulant 1400. However, the disclosure is not limited thereto. Depending on the amount of conductive paste dispensed, the top surfaces of the conductive features 1304b may be located at a level height higher than or lower than that of the top surface of the encapsulant 1400. For example, when excess amount of conductive paste is dispensed into the openings OP, the conductive features 1304b would protrude from the encapsulant 1400. On the other hand, when deficient amount of the conductive paste is dispensed into the openings OP, the conductive features 1304b would recess from the encapsulant 1400. In some embodiments, if the conductive paste protrudes from the openings OP, a coin process (i.e. a pressing process) may be performed to flatten the top surface of the conductive features 1304b such that the top surfaces of the conduvice features 1304b are substantially coplanar with the top surface of the encapsulant 1400, as shown in FIG. 4E.

As illustrated in FIG. 4E, the conductive features 1304b are formed on the conductive features 1302. In some embodiments, a shape of the conductive features 1304b is different from a shape of the conductive features 1302. For example, the conductive features 1304b include conductive conical frustum or the like. In some embodiments, a height of each conductive feature 1304b ranges from about 60 μm to about 180 μm. On the other hand, a maximum width/diameter of each conductive feature 1304b ranges from about 50 μm to about 200 μm.

In some embodiments, each conductive feature 1302 and each conductive feature 1304b are collectively referred to as a conductive structure 1300b. For example, the conductive feature 1302 may be referred to as a first portion of the conductive structure 1300b while the conductive feature 1304b may be referred to as a second portion of the conductive structure 1300b. As illustrated in FIG. 4E, the first portion of the conductive structure 1300b is connected to the second portion of the conductive structure 1300b. As mentioned above, the shape of the first portion (i.e. the conductive feature 1302) is different from the shape of the second portion (i.e. the conductive feature 1304b). Therefore, in some embodiments, a maximum width of the first portion is different from a maximum width of the second portion. For example, as illustrated in FIG. 4E, the maximum width of the first portion (i.e. the conductive feature 1302) is larger than the maximum width of the second portion (i.e. the conductive features 1304b).

In some embodiments, since the conductive features 1304b fill up the openings OP of the encapsulant 1400, the conductive features 1304b are being laterally encapsulated by the encapsulant 1400. In other words, the package structure PKG, the adhesive layer AD, the integrated circuit IC, and the conductive structures 1300b (i.e. the conductive features 1302 and the conductive features 1304b) are being encapsulated by the same encapsulant 1400. As illustrated in FIG. 4C to FIG. 4E, the step of encapsulating the package structure PKG, the conductive features 1302, and the integrated circuit IC precedes the step of forming the conductive features 1304b and the step of encapsulating the conductive features 1304b.

Figure 4F:
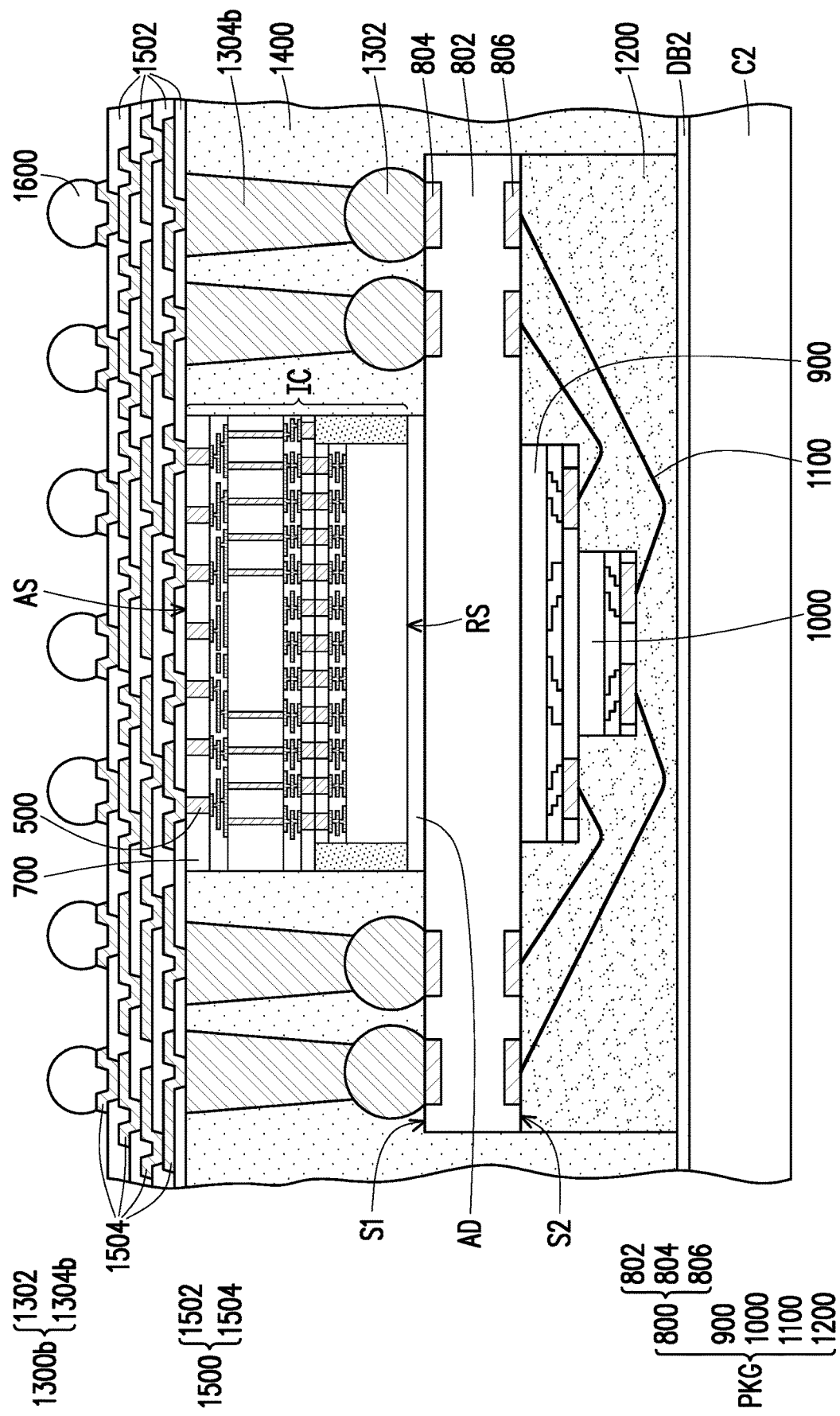

Referring to FIG. 4F, a redistribution structure 1500 and a plurality of conductive terminals 1600 are sequentially formed over the integrated circuit IC, the conductive structures 1300b, and the encapsulant 1400. In some embodiments, the redistribution structure 1500 and the conductive terminals 1600 in FIG. 4F are respectively similar to the redistribution structure 1500 and the conductive terminals 1600 in FIG. 2E, so the detailed descriptions thereof are omitted herein.

Figure 4G:
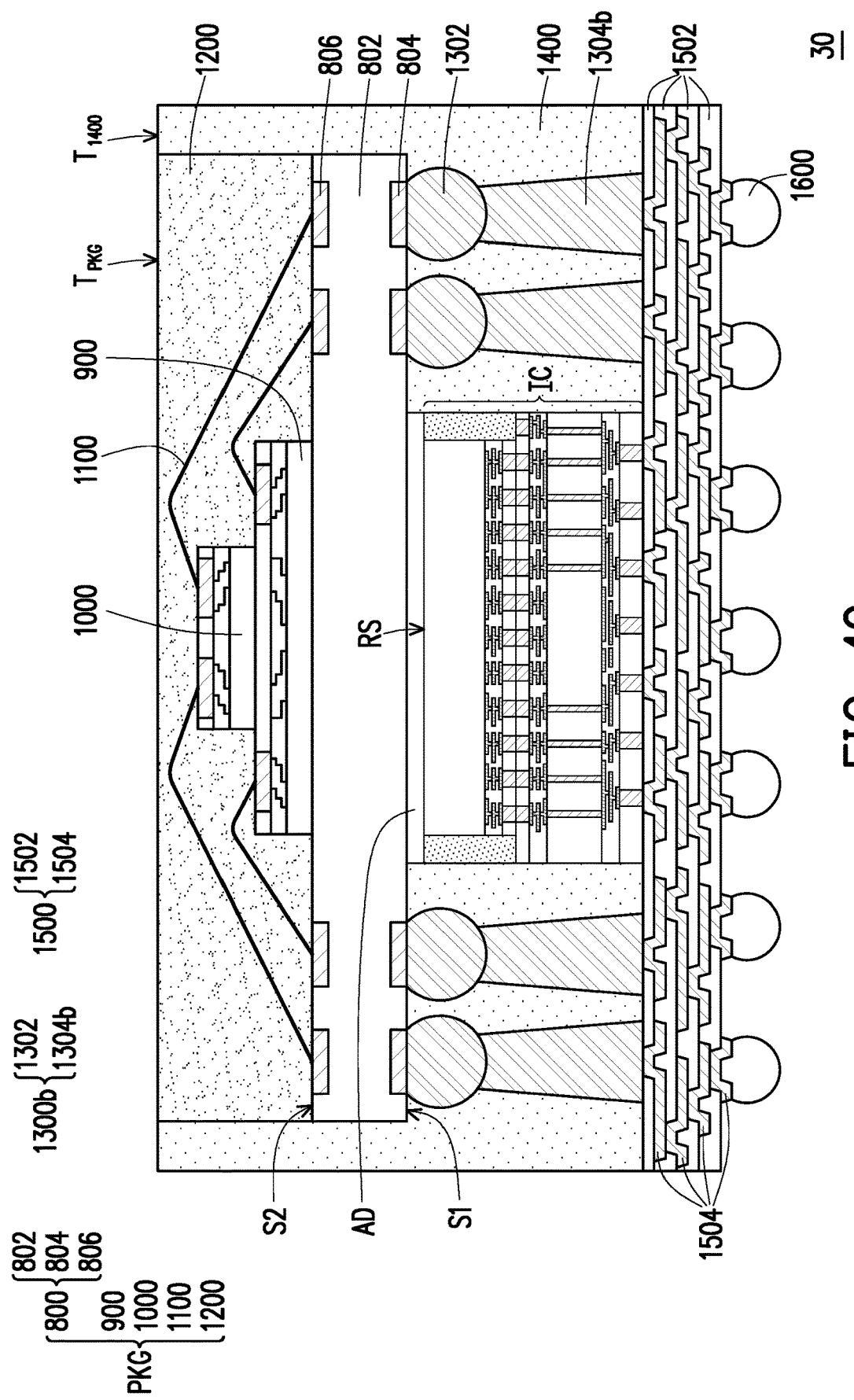

Referring to FIG. 4F and FIG. 4G, the package structure PKG and the encapsulant 1400 are de-bonded from the de-bonding layer DB2 and a singulation process is performed to obtain a plurality of semiconductor devices 30. The step shown in FIG. 4G is similar to the step shown in FIG. 2F, so the detailed description thereof is omitted herein. In some embodiments, each conductive structure 1300b includes the conductive feature 1302 and the conductive feature 1304b formed in different steps. Since the package structure PKG is embedded within the encapsulant 1400, the compactness of the semiconductor device 30 may be enhanced and the form factor may be reduced. Moreover, since the integrated circuit IC is attached to the package structure PKG, heat within the integrated circuit IC generated during operation of the semiconductor device 30 may be effectively dissipated through the heat dissipation route provided by the package structure PKG. As such, as compared to conventional structure where an air gap exists between the integrated circuit IC and the package structure PKG, the heat dissipation rate of the semiconductor device 30 may be sufficiently increased.

In accordance with some embodiments of the disclosure, a semiconductor device includes an integrated circuit, first conductive features, second conductive features, a package structure, and an encapsulant. The integrated circuit has an active surface and a rear surface opposite to the active surface. The first conductive features surround the integrated circuit. The second conductive features are stacked on the first conductive features. The package structure is disposed on the second conductive features and the rear surface of the integrated circuit. The encapsulant laterally encapsulates the integrated circuit, the first conductive features, the second conductive features, and the package structure.

In accordance with some alternative embodiments of the disclosure, a semiconductor device includes an integrated circuit, conductive structures, a package structure, and a first encapsulant. The conductive structures surround the integrated circuit. Each of the conductive structures includes a first portion and a second portion connected to the first portion. The package structure is disposed on the conductive structures and the integrated circuit. The first encapsulant laterally encapsulates the integrated circuit, the conductive structures, and the package structure. A top surface of the first encapsulant is coplanar with a top surface of the package structure.

In accordance with some embodiments of the disclosure, a manufacturing method of a semiconductor device includes at least the following steps. A package structure having first conductive features formed thereon is provided. Second conductive features are formed on the first conductive features. An integrated circuit is attached to the package structure. The integrated circuit is surrounded by the first conductive features. The package structure, the first conductive features, the second conductive features, and the integrated circuit are encapsulated by an encapsulant. A redistribution structure and conductive terminals are sequentially formed on the second conductive features, the integrated circuit, and the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    an integrated circuit having an active surface and a rear surface opposite to the active surface;
    first conductive features surrounding the integrated circuit, wherein each of the first conductive features is elliptical in a cross-sectional view;
    second conductive features stacked on the first conductive features, wherein a material of the first conductive features is different from a material of the second conductive features;
    a package structure disposed on the second conductive features and the rear surface of the integrated circuit; and
    an encapsulant laterally encapsulating the integrated circuit, the first conductive features, the second conductive features, and the package structure.

2. The semiconductor device of claim 1, wherein the material of the first conductive features comprises copper and the material of the second conductive features comprises solder.

3. The semiconductor device of claim 1, wherein a shape of the first conductive features is different from a shape of the second conductive features.

4. The semiconductor device of claim 1, wherein the first conductive features comprise elliptical conductive balls and the second conductive features comprise spherical conductive balls.

5. The semiconductor device of claim 1, further comprising:
    a redistribution structure disposed on the first conductive features and the active surface of the integrated circuit; and
    conductive terminals disposed on the redistribution structure.

6. The semiconductor device of claim 1, further comprising an adhesive layer sandwiched between the rear surface of the integrated circuit and the package structure, wherein the encapsulant laterally encapsulates the adhesive layer.

7. The semiconductor device of claim 6, wherein sidewalls of the adhesive layer are aligned with sidewalls of the integrated circuit.

8. A semiconductor device, comprising:
    an integrated circuit;
    conductive structures surrounding the integrated circuit, wherein each of the conductive structures comprises a first portion and a second portion connected to the first portion, the first portion is elliptical in a cross-sectional view, and a material of the first portion is different from a material of the second portion;
    a package structure disposed on the conductive structures and the integrated circuit; and
    a first encapsulant laterally encapsulating the integrated circuit, the conductive structures, and the package structure, wherein a top surface of the first encapsulant is coplanar with a top surface of the package structure.

9. The semiconductor device of claim 8, wherein an interface exists between the first portion and the second portion.

10. The semiconductor device of claim 8, wherein a maximum width of the first portion is different from a maximum width of the second portion.

11. The semiconductor device of claim 8, wherein the integrated circuit comprises:
    a first die;
    a second die stacked on and hybrid bonded to the first die; and
    a second encapsulant laterally encapsulating the second die.

12. The semiconductor device of claim 8, further comprising:
    a redistribution structure disposed on the conductive structures and the integrated circuit opposite to the package structure;
    conductive terminals disposed on the redistribution structure; and
    an adhesive layer sandwiched between the integrated circuit and the package structure.

13. The semiconductor device of claim 12, wherein a height of the conductive structures is substantially equal to a sum of a thickness of the adhesive layer and a thickness of the integrated circuit.

14. The semiconductor device of claim 12, wherein sidewalls of the adhesive layer are aligned with sidewalls of the integrated circuit.

15. The semiconductor device of claim 8, wherein the first portion comprises an elliptical conductive ball and the second portion comprises a spherical conductive ball.

16. A manufacturing method of a semiconductor device, comprising:
    providing a package structure having first conductive features formed thereon;
    forming second conductive features on the first conductive features, wherein each of the second conductive features is elliptical in a cross-sectional view, and a material of the first conductive features is different from a material of the second conductive features;
    attaching an integrated circuit to the package structure, wherein the integrated circuit has an active surface and a rear surface opposite to the active surface, the integrated circuit is surrounded by the first conductive features and the second conductive features, and the rear surface of the integrated circuit is attached to the package structure;
    encapsulating the package structure, the first conductive features, the second conductive features, and the integrated circuit by an encapsulant; and
    sequentially forming a redistribution structure and conductive terminals on the second conductive features, the integrated circuit, and the encapsulant.

17. The method of claim 16, wherein forming the second conductive features precedes encapsulating the package structure, the first conductive features, the second conductive features, and the integrated circuit.

18. The method of claim 16, wherein forming the second conductive features comprises:
    placing pre-formed elliptical conductive balls onto the first conductive features.

19. The method of claim 16, wherein the integrated circuit is attached to the package structure through a thermal interfacial material (TIM) layer.

20. The method of claim 16, wherein the first conductive features comprise spherical conductive balls and the second conductive features comprise elliptical conductive balls.

\* \* \* \* \*